(12) United States Patent
Kanri

(10) Patent No.: US 11,087,970 B2
(45) Date of Patent: Aug. 10, 2021

(54) BONDED WAFER, A METHOD OF MANUFACTURING THE SAME, AND A METHOD OF FORMING THROUGH HOLE

(71) Applicant: CANON KABUSHIKI KAISHA, Tokyo (JP)

(72) Inventor: Ryoji Kanri, Zushi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/556,095

(22) Filed: Aug. 29, 2019

(65) Prior Publication Data

US 2020/0075310 A1  Mar. 5, 2020

(30) Foreign Application Priority Data

Sep. 3, 2018 (JP) .............................. JP2018-164514

(51) Int. Cl.
| | |
|---|---|
| *H01L 21/02* | (2006.01) |
| *H01L 21/30* | (2006.01) |
| *H01L 23/31* | (2006.01) |
| *H01L 21/304* | (2006.01) |

(52) U.S. Cl.
CPC .. *H01L 21/02008* (2013.01); *H01L 21/02172* (2013.01); *H01L 21/02216* (2013.01); *H01L 21/3043* (2013.01); *H01L 23/315* (2013.01)

(58) Field of Classification Search
CPC ......... H01L 21/02008; H01L 21/02216; H01L 23/315; H01L 21/3043; H01L 21/02172
USPC ............................................ 438/458; 257/620
See application file for complete search history.

(56) References Cited

U.S. PATENT DOCUMENTS

| | | | | |
|---|---|---|---|---|
| 6,080,641 A | * | 6/2000 | Nihonmatsu | ........... B24B 9/065 257/E21.237 |
| 2003/0045031 A1 | * | 3/2003 | Kobayashi | ........... B23K 26/009 438/113 |
| 2003/0073264 A1 | * | 4/2003 | Meguro | .................. H01L 21/78 438/113 |
| 2005/0023647 A1 | * | 2/2005 | Nemoto | .................. H01L 21/78 257/620 |
| 2005/0145879 A1 | * | 7/2005 | Nakayama | ........ H01L 21/02008 257/103 |
| 2006/0264006 A1 | * | 11/2006 | Kian | ....................... H01L 24/83 438/464 |

(Continued)

FOREIGN PATENT DOCUMENTS

| | | | |
|---|---|---|---|
| JP | 2004281551 A | * | 10/2004 |
| JP | 2004281551 A | | 10/2004 |

*Primary Examiner* — Sheikh Maruf
(74) *Attorney, Agent, or Firm* — Canon U.S.A., Inc., IP Division

(57) ABSTRACT

A bonded wafer includes: a first wafer having a first surface and a second surface opposite to the first surface, and including a functional element on the first surface; and a second wafer in which a structure having at least one of a hole, a groove and a cavity is formed; wherein an annular protrusion is formed to have a shape to extend along an outer periphery on the second surface of the first wafer; wherein at least a portion of the second wafer is a reduced-diameter portion having a diameter smaller than an inner diameter of the annular protrusion; and wherein, under a state in which the reduced-diameter portion is fitted into a region surrounded by the annular protrusion of the first wafer, the second wafer is bonded to the second surface at least at the region.

12 Claims, 19 Drawing Sheets

(56) References Cited

U.S. PATENT DOCUMENTS

| | | | |
|---|---|---|---|
| 2009/0017598 A1* | 1/2009 | Shimomura | H01L 27/1266 438/458 |
| 2010/0213618 A1* | 8/2010 | Pagaila | H01L 24/19 257/774 |
| 2011/0298021 A1* | 12/2011 | Tada | H01L 27/1266 257/288 |
| 2012/0218352 A1* | 8/2012 | Fujii | B41J 2/1646 347/47 |
| 2012/0313222 A1* | 12/2012 | Lee | H01L 23/49827 257/620 |
| 2012/0315739 A1* | 12/2012 | Hashii | B24B 27/0633 438/460 |
| 2015/0115411 A1* | 4/2015 | Ozaki | H01L 29/7786 257/620 |
| 2015/0364376 A1* | 12/2015 | Yu | H01L 24/11 257/620 |
| 2016/0079117 A1* | 3/2016 | Graf | H01L 21/67115 438/464 |
| 2016/0093555 A1* | 3/2016 | Takeda | H01L 23/53238 438/653 |
| 2016/0141209 A1* | 5/2016 | Takano | H01L 21/02076 257/620 |
| 2016/0163579 A1* | 6/2016 | Nakamura | B32B 38/0012 428/64.1 |
| 2016/0254160 A1* | 9/2016 | Kashiwazaki | H01L 21/283 257/620 |
| 2016/0293473 A1* | 10/2016 | Yoshihara | H01L 23/49562 |
| 2018/0247860 A1* | 8/2018 | Ishizuka | H01L 27/1203 |
| 2019/0131289 A1* | 5/2019 | Chen | H01L 21/31144 |
| 2020/0144210 A1* | 5/2020 | Nishizawa | H01L 21/50 |

\* cited by examiner

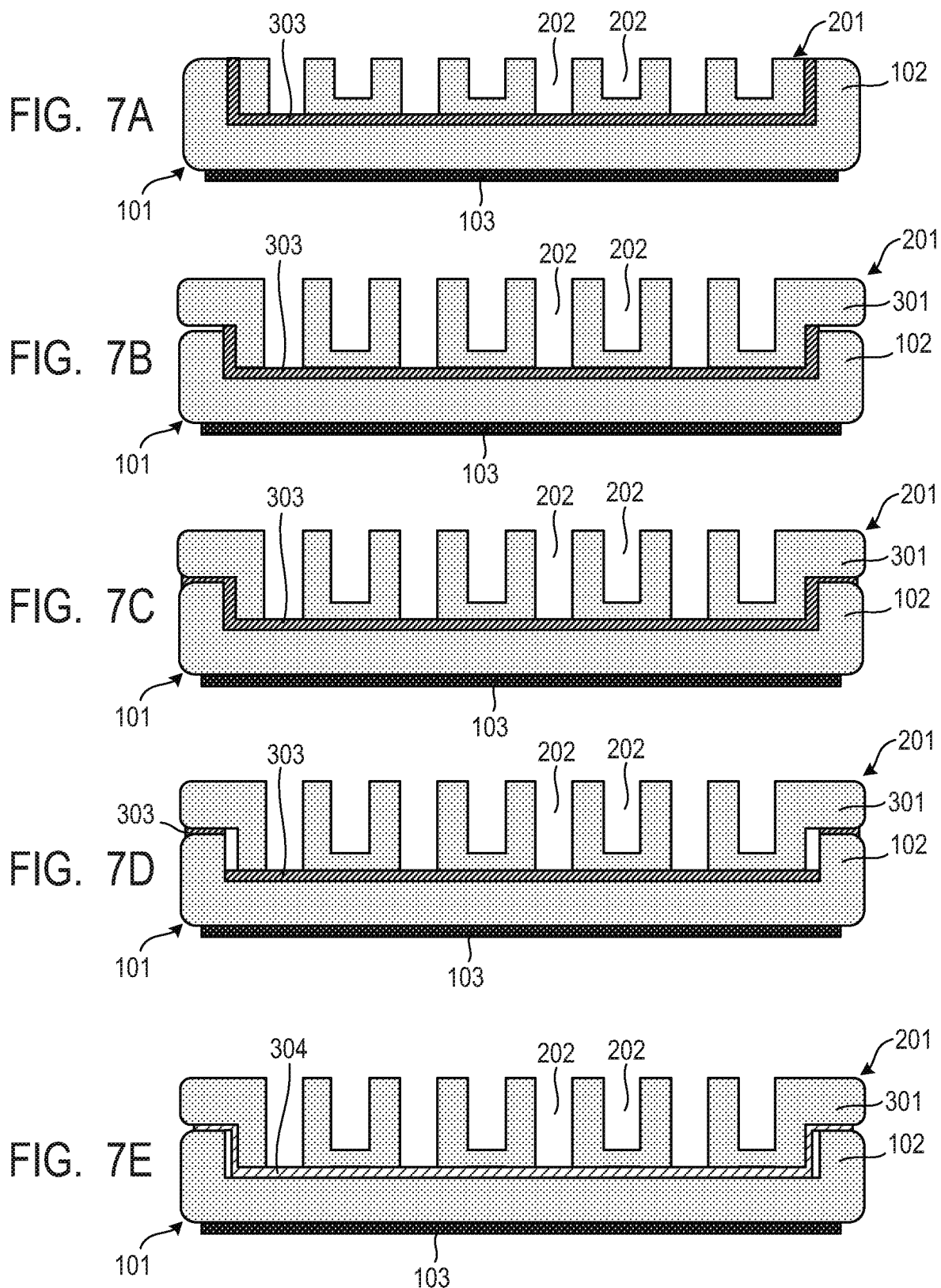

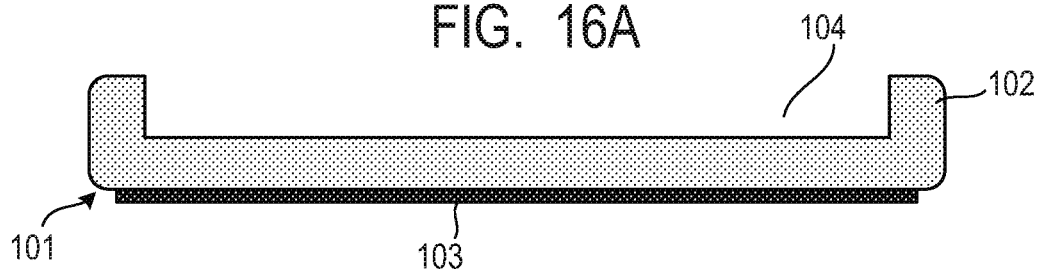
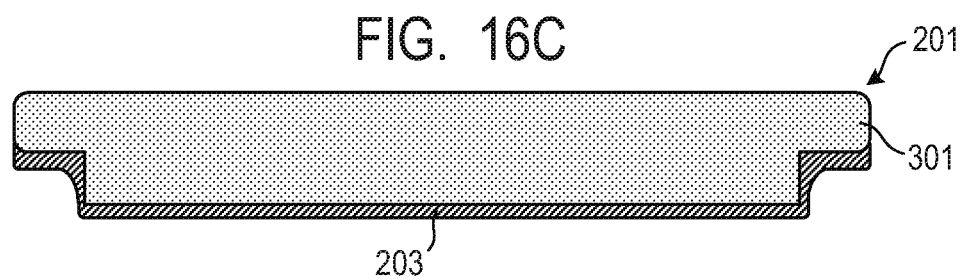
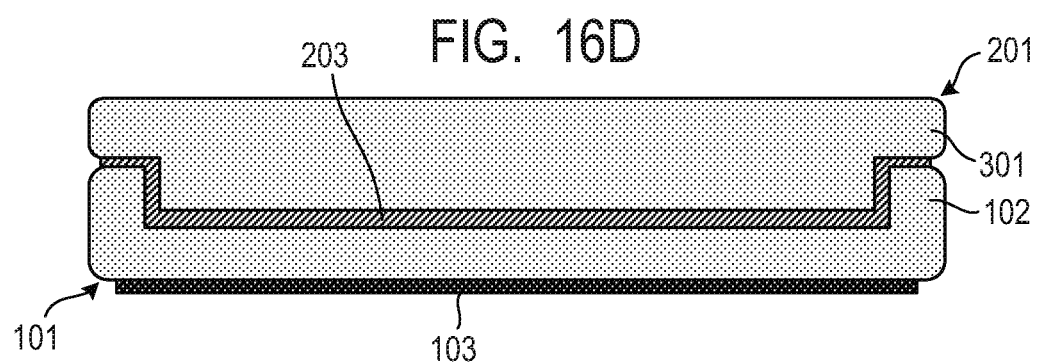
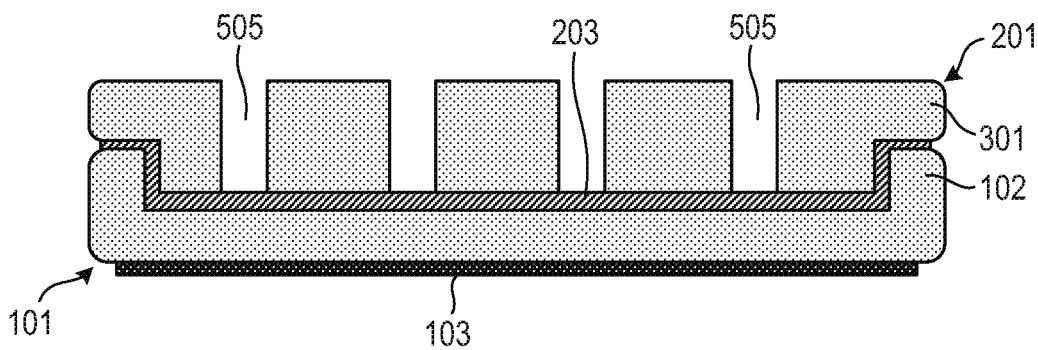

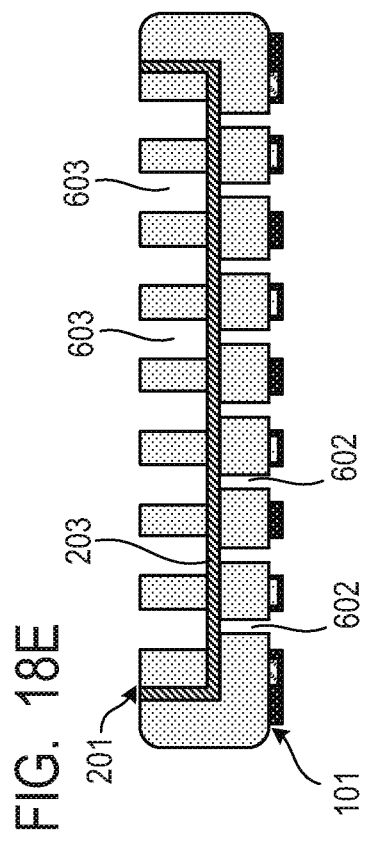
FIG. 18A
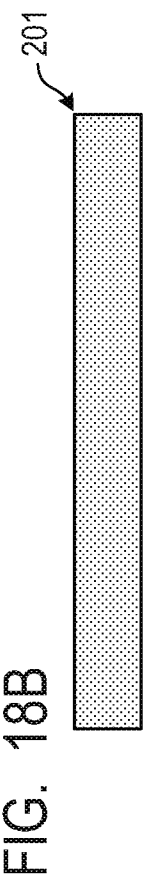
FIG. 18B
FIG. 18C
FIG. 18D
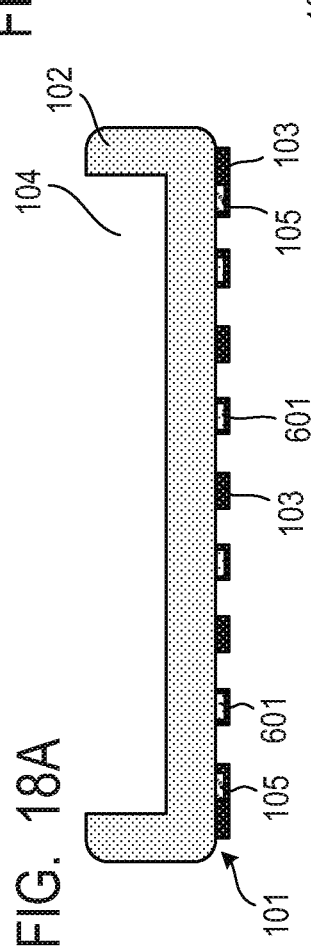
FIG. 18E
FIG. 18F
FIG. 18G
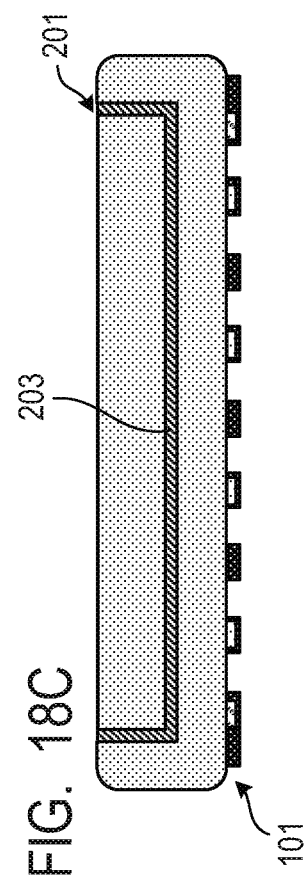
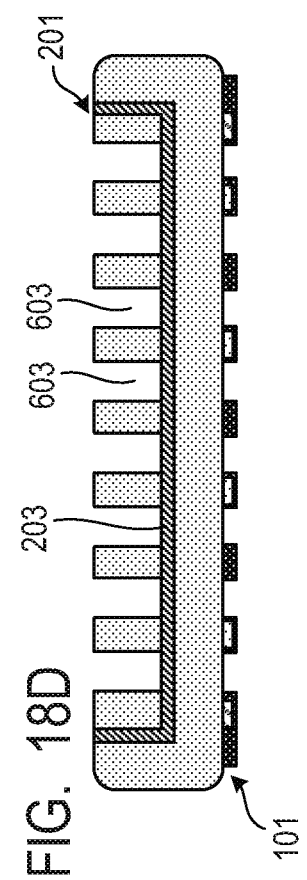

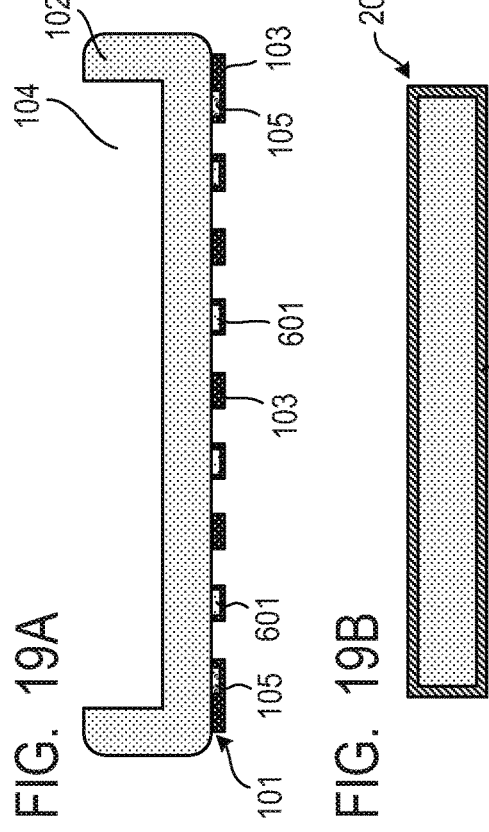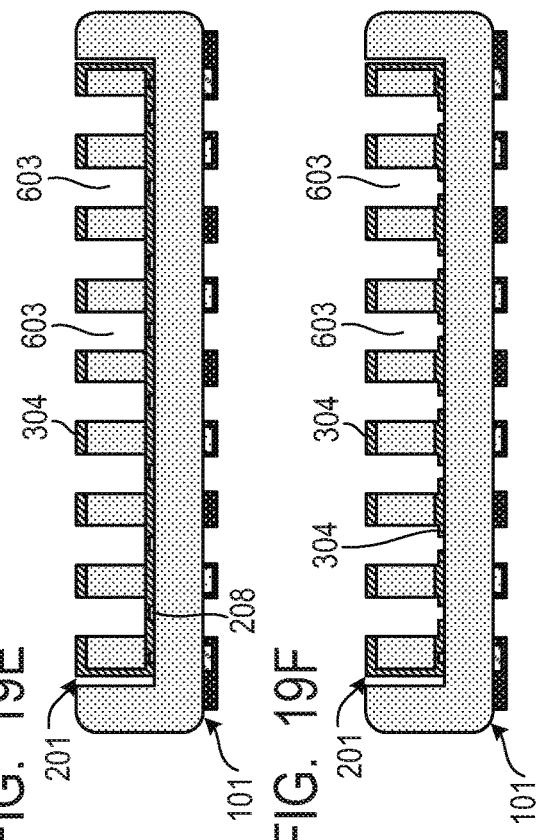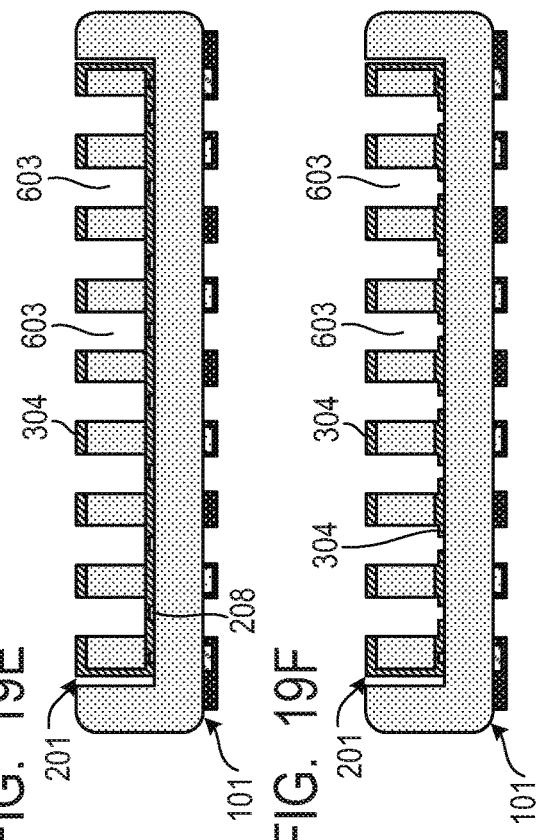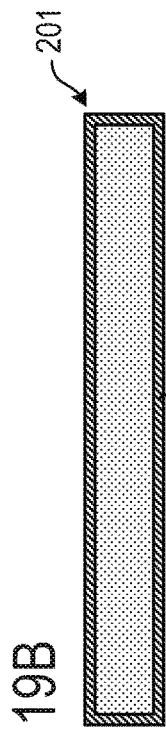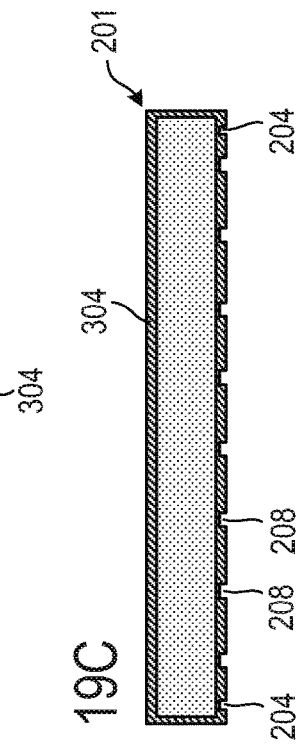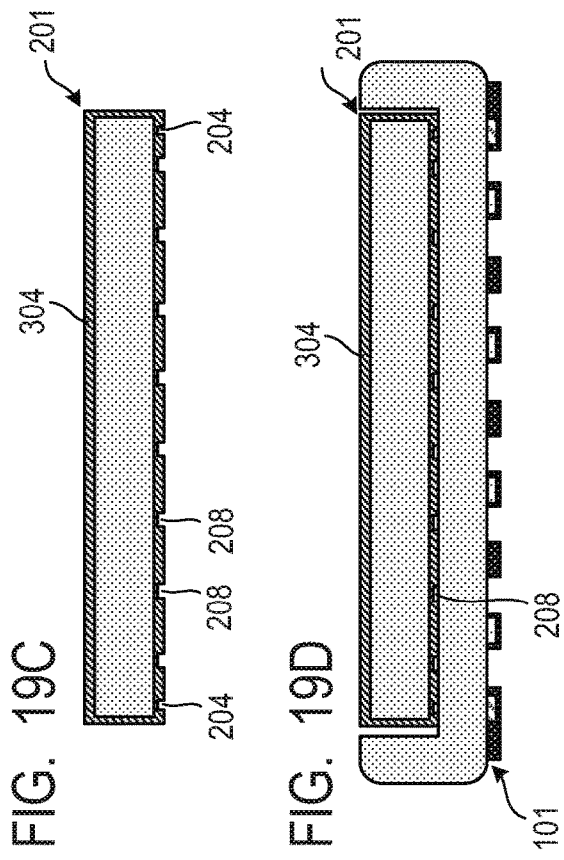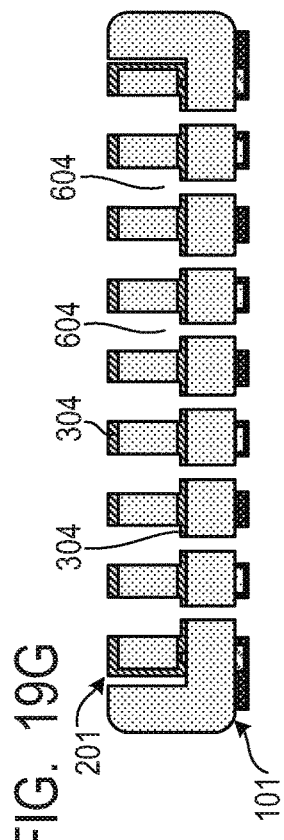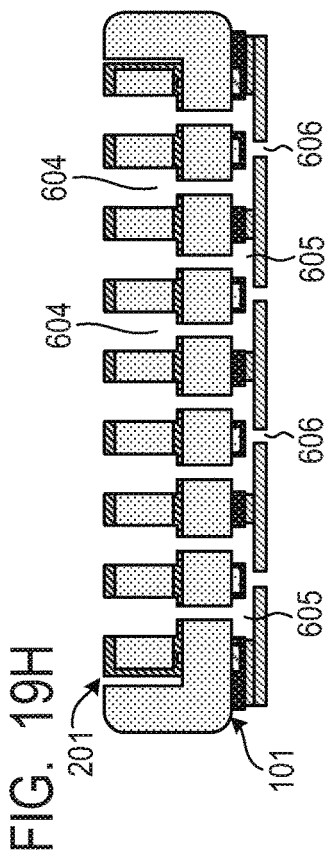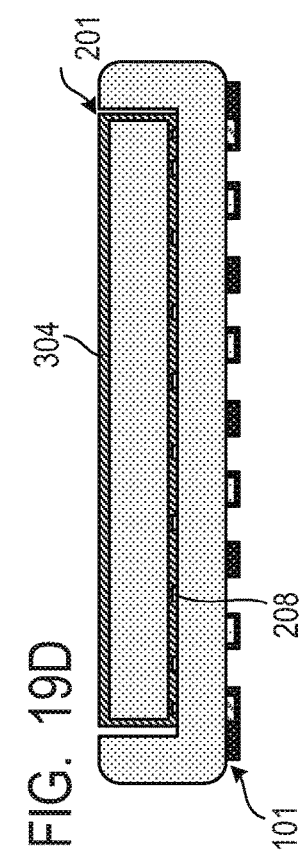

BONDED WAFER, A METHOD OF MANUFACTURING THE SAME, AND A METHOD OF FORMING THROUGH HOLE

BACKGROUND OF THE INVENTION

Field of the Invention

The present disclosure relates to, for example, a bonded wafer to be used for micro devices, a method of manufacturing the same, and a method of forming through holes to be applied to the bonded wafer.

Description of the Related Art

As applications of a semiconductor device manufacturing technology, there are exemplified manufacturing of micro devices such as various sensors, micro electro-mechanical system (MEMS) devices represented by liquid discharge heads configured to discharge liquid from a fine ejection orifices. In the micro devices, in order to use mechanical characteristics, at least one of wafers to be used may be rendered to be a thin wafer in some cases. In manufacture of micro devices, a bonded structure including a plurality of wafers is used in many cases. For example, in acceleration sensors or the like, the bonded structure of the wafer may be used for vacuum sealing of the device structure or support of a structure. Further, in liquid discharge heads, pressure sensors, or the like, the laminated wafer itself may be used as a structure including holes, grooves, and cavities. In those cases, it is required that the wafer including the structure be bonded to each other or be bonded with thin wafers.

In particular, in a case in which a thin wafer is to be a bonded target, the strength of the wafer is extremely weak, and hence it may be required that the wafer be bonded with another wafer under a state to be supported by a certain support, and after the bonding, a step of peeling off the support be performed. Further, in order to convey the thin wafers, the support may be required. As the support, a silicon wafer, a quartz wafer or a glass wafer, a resin substrate, a tape, or the like may be used. However, disposal of those supports after use becomes one of causes to an increase in manufacturing costs. Even when reuse of the support is available, the support is reused after being subjected to treatment such as washing, which also becomes one of causes to an increase in manufacturing cost and an increase in a process load. When an adhesive is used for bonding the support to the wafer, it is required to remove the adhesive later. However, removal residues and the like should not exist even after passing through a heating history during the processes, characteristics required for the adhesive have many limitations, with the result that the choice of an adhesive is difficult. From those reasons, a method is sought, which can make a wafer thinner, thereby being capable of performing conveyance and lamination bonding without using an exclusive support as much as possible.

As a technology which makes a wafer thin without using an exclusive support, in Japanese Patent Application Laid-Open No. 2004-281551, there is disclosed a technology in which the strength is secured by a rib-shaped thick portion which is left on an outer peripheral portion of the wafer at the time of performing a process to remove a portion of the wafer for thinning A configuration having the rib-shaped thick portion on the outer peripheral portion of the wafer as described in Japanese Patent Application Laid-Open No. 2004-281551 can be said to meet requirements in that the strength of the wafer can be maintained without using an exclusive support. However, when a sensor or a liquid discharge head as an example of a micro device is produced, the bonded wafer itself may be formed as a structure. In this case, in order to form the bonded wafer as the structure, when another wafer is attempted to be laminated on a thin wafer, the rib-shaped thick portion on the outer peripheral portion interferes with the bonding of another structure (wafer) on a side of a surface processed to be thin. That is, in the configuration in which a thin wafer is formed by leaving a rib-shaped thick portion on an outer peripheral portion of a wafer, there is a disadvantage in that the bonding of another wafer serving as a structure is difficult.

SUMMARY OF THE INVENTION

According to at least one aspect of the present disclosure, there is provided a bonded wafer including: a first wafer having a first surface and a second surface opposite to the first surface, and including a functional element on the first surface; and a second wafer in which a structure having at least one of a hole, a groove and a cavity is formed; wherein an annular protrusion is formed to have a shape to extend along an outer periphery on the second surface of the first wafer; wherein at least a portion of the second wafer is a reduced-diameter portion having a diameter smaller than an inner diameter of the annular protrusion; and wherein, under a state in which the reduced-diameter portion is fitted into a region surrounded by the annular protrusion of the first wafer, the second wafer is bonded to the second surface at least at the region.

Further features of the present disclosure will become apparent from the following description of exemplary embodiments with reference to the attached drawings.

BRIEF DESCRIPTION OF THE DRAWINGS

FIG. 7A, FIG. 7B, FIG. 7C, FIG. 7D, and FIG. 7E are sectional views of the bonded wafer.

FIG. 16A, FIG. 16B, FIG. 16C, FIG. 16D, and FIG. 16E are sectional views for illustrating a procedure of manufacturing the bonded wafer in Example 3 of the present disclosure.

FIG. 18A, FIG. 18B, FIG. 18C, FIG. 18D, FIG. 18E, FIG. 18F, and FIG. 18G are sectional views for illustrating a procedure of manufacturing a liquid discharge head wafer in Example 5 of the present disclosure.

FIG. 19A, FIG. 19B, FIG. 19C, FIG. 19D, FIG. 19E, FIG. 19F, FIG. 19G, and FIG. 19H are sectional views for illustrating a procedure of manufacturing the liquid discharge head wafer in Example 6 of the present disclosure.

DESCRIPTION OF THE EMBODIMENTS

Figure 1:
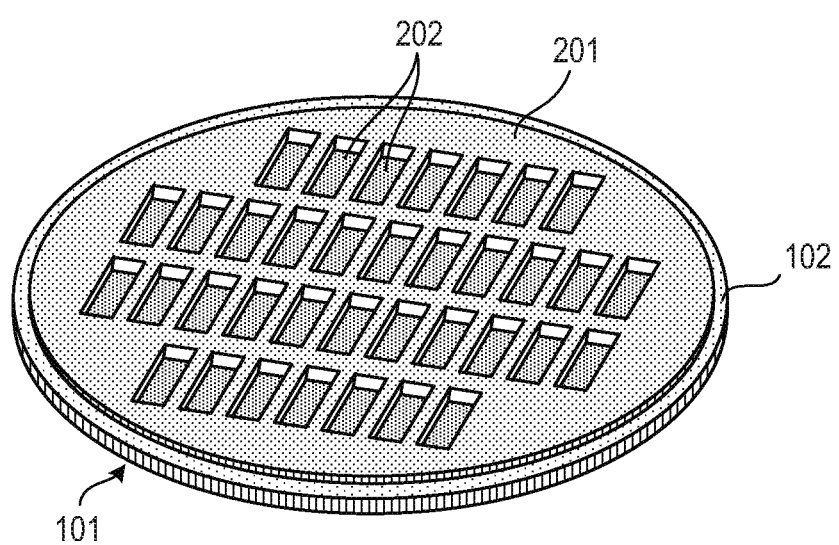
FIG. 1 is a perspective view for illustrating a bonded wafer according to at least one aspect of the present disclosure.
Figure 2A:
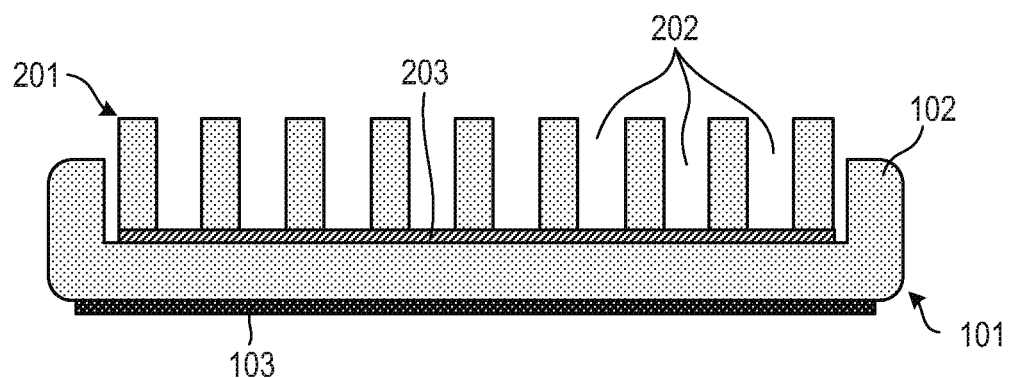
FIG. 2A, FIG. 2B, and FIG. 2C are sectional views of the bonded wafer illustrated in FIG. 1.
Figure 2B:
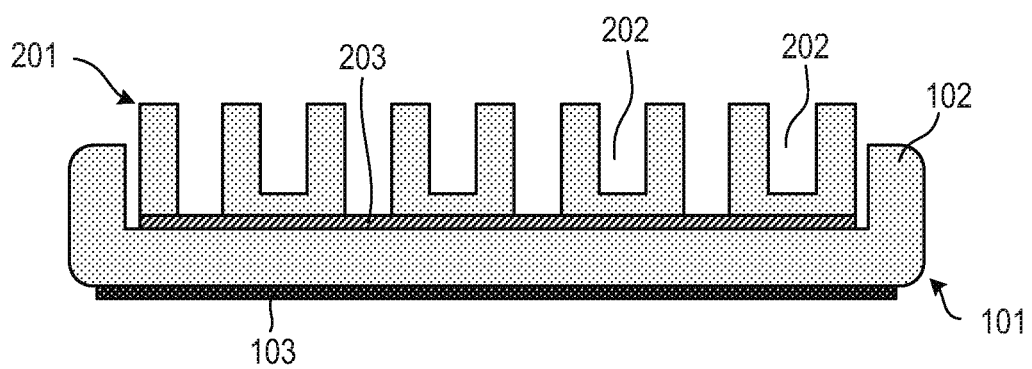
Figure 2C:
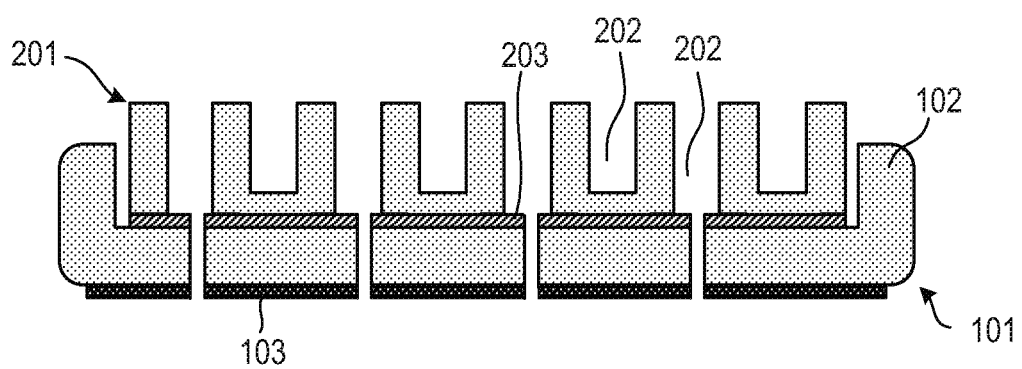

Next, at least one aspect of the present disclosure is described with reference to the drawings. FIG. 1 is a perspective view of a bonded wafer according to one aspect of the present disclosure, and FIG. 2A to FIG. 2C are conceptual views each illustrating an example of a sectional configuration of the bonded wafer illustrated in FIG. 1.

The bonded wafer illustrated in FIG. 1 and FIG. 2A to FIG. 2C is formed of a disc-shaped first wafer 101 and a disk-shaped second wafer 201 bonded to the first wafer 101. On a first surface (lower surface of FIG. 2A to FIG. 2C) of the first wafer 101, a functional element 103 such as various semiconductor elements, resistance elements, and capacitance elements are formed. On a second surface opposite to the first surface of the first wafer 101, an annular protrusion 102 is provided to have a shape which extends along an outer periphery of the first wafer 101. A region surrounded by the annular protrusion 102 in the second surface is a recess 104 (see FIG. 3). In the first wafer 101, because the annular protrusion 102 is provided, even when the region of the recess 104 is thin, an occurrence of breakage such as cracking during a manufacturing process is suppressed. In general, in a case of a silicon semiconductor wafer, when the wafer has a diameter of 200 mm (so-called 8-inch wafer) and a thickness thereof is less than about 400 µm, a frequency of occurrence of cracking increases. In particular, when the thickness is 200 µm or less, though manufacturing process flow alone without use of a support is very difficult, in the first wafer 101 which is a thin wafer provided with the annular protrusion 102, the manufacturing process flow is available even when the thickness of the wafer is 100 µm or less.

In the recess 104 surrounded by the annular protrusion 102 in the second surface of the first wafer 101, a second wafer 201 which has a diameter smaller than an inner diameter (diameter of the recess 104) of the annular protrusion 102 is laminated to be fitted therein. In the second wafer 201, structural bodies 202 such as holes, grooves, or cavities, which serve as mechanical structures of a micro device, are formed. For example, when a liquid discharge head which discharges liquid from ejection orifices is formed as a micro device, in the second wafer 201, the grooves serving as flow paths of the liquid or the holes serving as liquid supply ports are formed as the structural bodies. In the case of the liquid discharge head, the liquid ejection orifices are provided in the first wafer 101, and energy generating elements, which generate energy required to discharge the liquid, are also provided on the first wafer 101 as the functional element 103. When a pressure sensor or a microphone is formed, a hole or a groove to form a membrane structure is included in each structure 202, and when a cantilever or a mirror device is formed, a frame configured to hold those element portions is included in each structure 202. The structural bodies 202 may be holes or grooves which penetrate the second wafer 201 as illustrated in FIG. 2A, or may have shallow shapes in which the second wafer 201 is engraved halfway in a thickness direction thereof as illustrated in FIG. 2B. The structural bodies 202 may be combinations of the holes or the grooves which penetrate through and shallow shapes formed by being engraved halfway. Further, the structural bodies 202 may not be formed only in the second wafer 201, but may also be formed in the first wafer 101 (holes in the first wafer 101) as illustrated in FIG. 2C.

Figure 3:
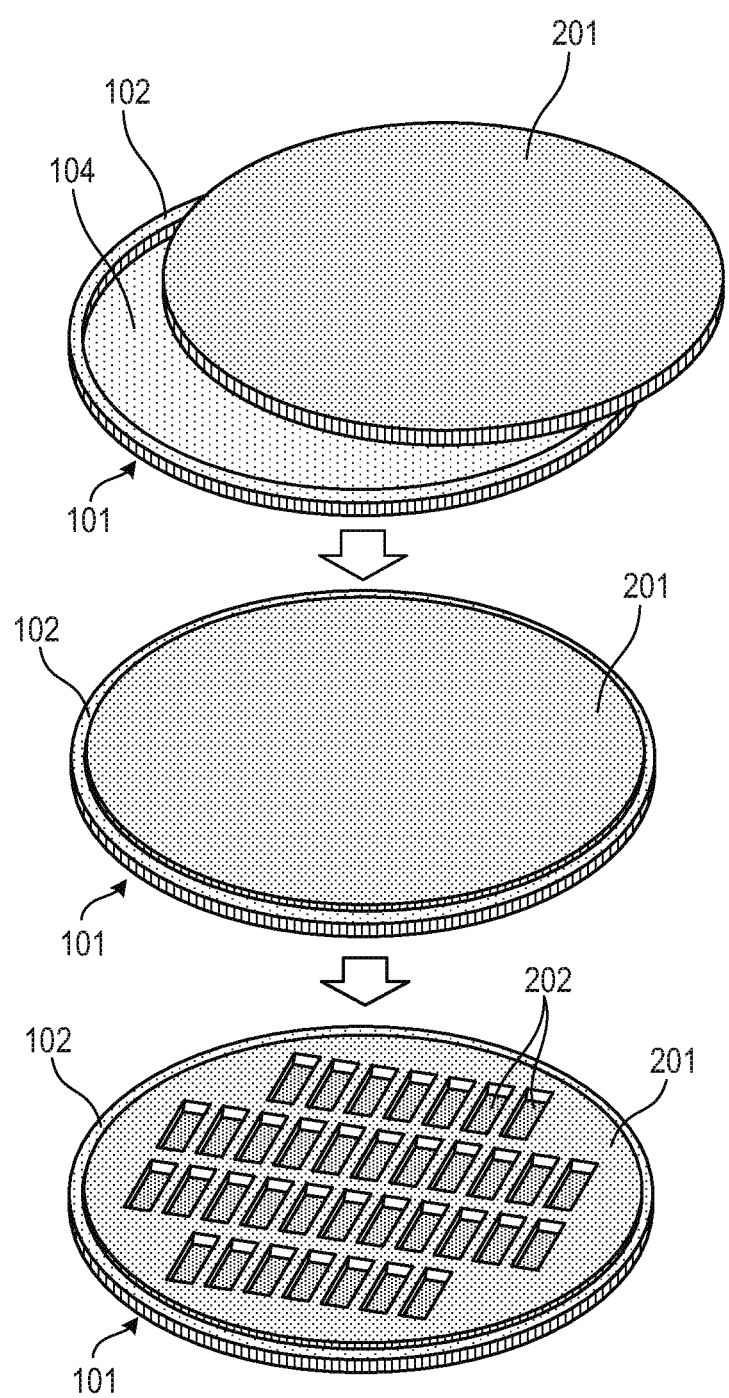
FIG. 3 is a view for conceptually illustrating an example of a manufacturing process of the bonded wafer.
Figure 4:
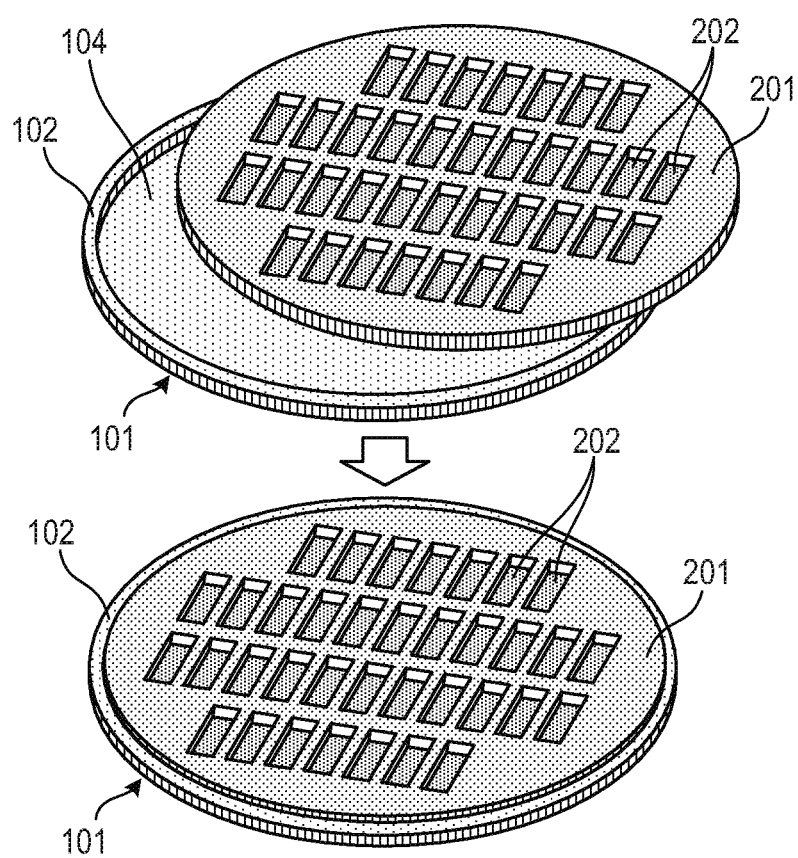
FIG. 4 is a view for conceptually illustrating another example of the manufacturing process of the bonded wafer.

FIG. 3 and FIG. 4 illustrate a manufacturing process of the bonded wafer described above, respectively. In the manufacturing process illustrated in FIG. 3, the first wafer 101, in which the annular protrusion 102 is already formed, is prepared, and the second wafer 201, in which the structural bodies are not provided, is bonded to the recess 104 of the first wafer 101. After the first wafer 101 and the second wafer 201 are bonded to each other, the second wafer 201 is processed to form the structural bodies 202 in the second wafer 201. Meanwhile, in the manufacturing process illustrated in FIG. 4, the second wafer 201, in which the structural bodies 202 which are at least one of holes, grooves and cavities are processed in advance, is bonded in the recess 104 of the first wafer 101 having the annular protrusion 102. The bonded wafer of this aspect can be manufactured through the manufacturing process as illustrated in FIG. 3 or the manufacturing process as illustrated in FIG. 4. As a method of bonding the first wafer 101 and the second wafer 201, for example, when the first wafer 101 is a silicon semiconductor wafer and the second wafer 202 is a glass wafer, a method such as anodic bonding or direct bonding can be employed.

As illustrated in FIG. 2A to FIG. 2C, the first wafer 101 and the second wafer 201 can also be bonded through an intermediate layer 203. The intermediate layer 203 is made of, for example, one or more materials selected from a group consisting of silicon oxide, an organic resin, metal, and metal oxide. It is determined which intermediate layer 203 may be used based on materials forming the first wafer 101 and the second wafer 201, respectively. For example, when the first wafer 101 and the second wafer 201 are both silicon wafers, the following methods are known, which use the intermediate layer 203, and can be suitably used:

Direct bonding through a silicon oxide film or a metal oxide film formed on any one of or both wafers;

Glass frit bonding through a low melting point glass;

Diffusion bonding with metal films such as Au, Cu, and Al formed on both wafers; Eutectic bonding such as Au-Sn through metal films formed on respective wafers; and Adhesive bonding through an organic resin such as polyimide, an epoxy resin, or silicone.

Here, the case, in which silicon wafers are bonded to each other, is described, but, depending on a type of the intermediate layer 203 and a bonding method, it is possible to bond without selecting the type of wafers to be bonded.

In the present disclosure, an example of the wafer that can be used in the first wafer 101 and the second wafer 201 is a silicon wafer. Examples thereof also include a glass wafer, a metal wafer formed of stainless steel or aluminum, a resin wafer formed of polyethylene terephthalate (PET), polyimide, or a fiber-reinforced resin (FRP), and a ceramic wafer formed of alumina, silicon carbide, or the like.

Figure 5:
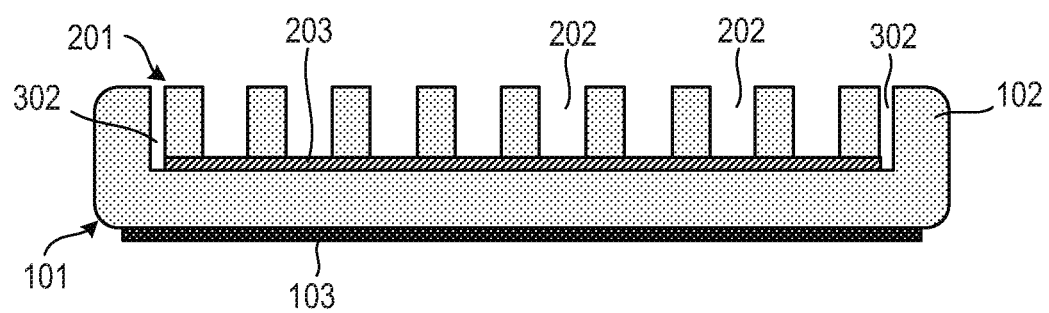
FIG. 5 is a sectional view of the bonded wafer.

A thickness of the second wafer 201 can be freely set in accordance with structural requirements for a device to be manufactured using the bonded wafer. From the viewpoint of the manufacturing process flow of the wafers already bonded, as illustrated in FIG. 5, it is preferred that a height of a top of the annular protrusion 102 of the first wafer 101 and a height of the bonded second wafer 201 be constant in a direction perpendicular to the second surface of the first wafer 101. The height of the second wafer 201 is a height indicated by a position of a surface opposite to a bonding surface with the first wafer 101 of the second wafer 201. That is, when a surface, on which the functional element 103 is not provided in the bonded wafer, is defined as a rear surface, it is preferred that the rear surface of the bonded wafer be substantially a flat surface. Here, the term "the height of the second wafer 201" refers to a distance how far the surface of the second wafer 201 opposite to the surface bonded to the first wafer 101 is away from the second surface of the first wafer 101 in the recess 104. Further, the term "a height being constant" refers to a state in which a level difference is suppressed to an extent that there is no problem from the viewpoint of the manufacturing process flow such as conveyance or holding of the bonded wafer.

The first wafer 101, which is a thin wafer, is generally produced from a normal (for example, commercially available) wafer which is processed to leave the annular protrusion 102. For that reason, in the annular protrusion 102, a thickness and an outer peripheral shape of the normal wafer are often maintained. Therefore, the second wafer 201 is set to have a thickness which forms a flat surface without protruding from a surface of the top of the annular protrusion 102, and hence an outer shape of the bonded wafer is made to be substantially the same as the normal wafer. As a result, it is possible to suppress an influence on conveyance and adsorptive fixation of the wafer, which is caused by a level difference or a gap in the rear surface of the wafer, or a difference in an outer peripheral shape. In particular, it is preferred to suppress variation in the level difference, that is, in a thickness direction within about 10% or less with respect to a total thickness of the wafer. When a wafer has a diameter of 200 mm, a thickness thereof is generally 725 μm, and hence it is preferred to suppress the level difference in the rear surface of the bonded wafer under about 70 μm or less. More preferably, it is preferred to suppress the level difference under about a thickness tolerance standard of the silicon wafer, specifically under about 20 μm or less.

Figure 6:
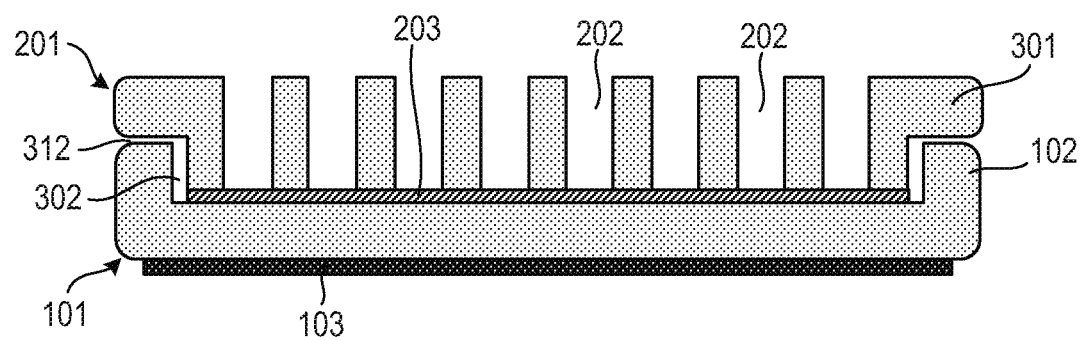
FIG. 6 is a sectional view of the bonded wafer.

From a reason of a device structure, there are some cases in which a thickness of a portion of the annular protrusion 102 of the first wafer 101 is desirably smaller than that of the normal wafer, or a thickness of the second wafer 201 is desirably larger than a depth of the annular protrusion 102. In this case, as illustrated in FIG. 6, a diameter of the second wafer 201 itself can be made larger than an inner diameter of the annular protrusion 102, and the surface of the second wafer 201 to be bonded to the first wafer 101 can be processed into a step-shaped portion 301 corresponding to a shape of the annular protrusion 102. In this case, the portion processed to correspond to the shape of the annular protrusion 102 is a portion (hereinafter referred to as reduced-diameter portion) having a diameter smaller than the inner diameter of the annular protrusion 102, and the reduced-diameter portion has a shape to be fitted into the recess 104 formed in the second surface of the first wafer 101. The surface of the second wafer 201 to be bonded to the first wafer 101 is a surface facing the first wafer 101 in the reduced-diameter portion. The step-shaped portion 301 is a portion having a diameter larger than the inner diameter of the annular protrusion 102 in the second wafer 201, and covers at least a portion of the annular protrusion 102. In this way, the second wafer 201 is formed, and, regardless of the height of the annular protrusion 102 and the thickness of the second wafer 201, at least the rear surface of the bonded wafer is free from a level difference or a gap, and hence the influence on conveyance or adsorptive fixation can be suppressed.

In the configuration illustrated in FIG. 6, the second wafer 201 having a diameter larger than that of the first wafer 101 is processed into a step-shape to have the reduced-diameter portion so that the step-shaped portion 301 of the second wafer 201 is provided to cover the annular protrusion 102. The bonded wafer illustrated in FIG. 6 is different from those illustrated in FIG. 1 to FIG. 5 in that the diameter of the second wafer 201 is larger than the inner diameter of the annular protrusion 102. After all, in the bonded wafer according to the present disclosure, at least a portion of the second wafer 201 is the reduced-diameter portion as the portion having a diameter smaller than the inner diameter of the annular protrusion 102, and it is only required that the reduced-diameter portion can be fitted into the region surrounded by the annular protrusion 102.

Regardless of thickness setting of each of the wafers 101 and 201 and outer peripheral shape setting of the bonded wafer, between the annular protrusion 102 of the first wafer 101 and a side surface of the second wafer 201, as illustrated in FIG. 5 or FIG. 6, a gap 302 is substantially generated in an in-plane direction of the second surface. When the second wafer 201 is processed into the step-shaped portion 301 corresponding to the annular protrusion 102 of the first wafer 101 such that the reduced-diameter portion is formed, a gap 312 (see FIG. 6) is generated also in the thickness direction of the bonded wafer. At the positions of those gaps, the wafers 101 and 201 are not bonded, and hence there is a fear in that breakage such as cracking or chipping of the wafer may occur at the positions. Therefore, it is preferred that the annular protrusion 102 of the first wafer 101 and the side surface or the step-shaped portion of the second wafer 201 be mutually bonded. FIG. 7A to FIG. 7E are views, in the configurations illustrated in FIG. 5 and FIG. 6, for illustrating configurations in which the first wafer 101 and the second wafer 201 are also bonded at the positions of the gaps 302 and 312. However, in FIG. 7A to FIG. 7E, in consideration of application to a liquid discharge head or the like, through holes are also formed as structural bodies in the first wafer 101. FIG. 7A is a view for illustrating an example in which an adhesive 303 is used as an intermediate layer which bonds the first wafer 101 and the second wafer 201 to each other, and is also filled in the gap 302 in the case illustrated in FIG. 5. FIG. 7B is a view for illustrating an example in which the adhesive 303 is also filled in the gap 302 in the configuration illustrated in FIG. 6. FIG. 7C is a view for illustrating an example in which the adhesive 303 is filled in the gaps 302 and 312 in the configuration illustrated in FIG. 6. FIG. 7D is a view for illustrating an example in which the adhesive 303 is filled in the gap 312 in the configuration illustrated in FIG. 6. FIG. 7E is a view for illustrating an example, in which the second wafer 201 is a silicon wafer and when the second wafer 201 is bonded to the first wafer 101 by direct bonding through a silicon oxide film (thermal oxide film 304) formed on a surface of the second wafer 201, processing accuracy in the thickness direction of the step-shaped portion 301 is enhanced. The processing accuracy enhanced in the thickness direction of the step-shaped portion 301 allows for direct bonding without the gap 312 being generated in the configuration illustrated in FIG. 6.

Figure 8A:
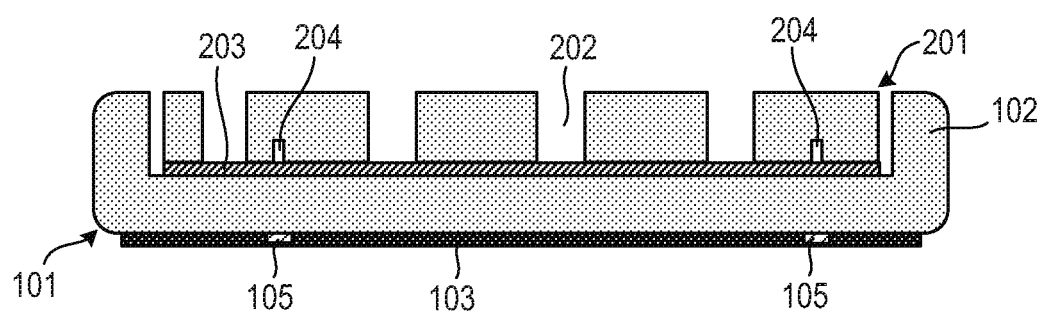
FIG. 8A and FIG. 8B are sectional views for describing alignment between the wafers.
Figure 8B:
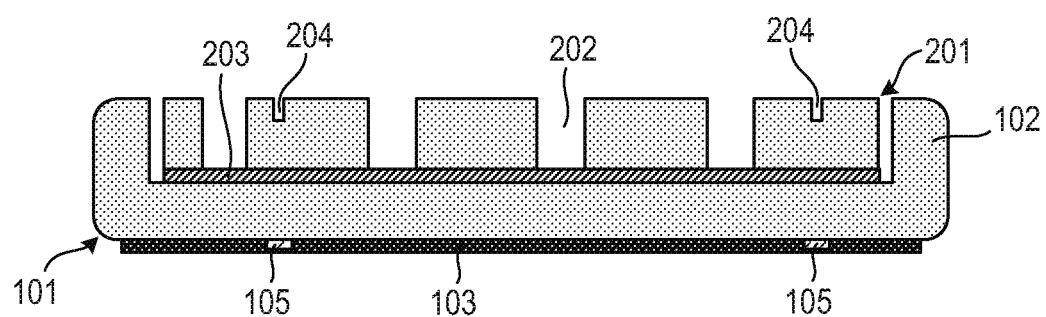

When the second wafer 201 is bonded to the first wafer 101 after the structural bodies 202 such as holes, grooves, and cavities are formed in the second wafer 201 in advance, alignment between the first wafer 101 and the second wafer 201 is important. Further, in a case in which certain patterns are formed in the intermediate layer 203 in advance, after the wafers 101 and 201 are mutually bonded, and then the structural bodies 202 are processed with the use of the patterns, the alignment is also important. Here, the alignments in these cases are relative alignments between the functional element 103 or patterns (for example, wiring patterns) formed on the first wafer 101 and the structural bodies 202 or patterns formed (to be formed) in the second wafer 201. In the alignment, as illustrated in FIG. 8A and FIG. 8B, a method of alignment can be employed, in which patterns 204 for alignment corresponding to patterns 105 formed on the first wafer 101 are formed in the second wafer 202 in advance, and the wafers are aligned with the use of the patterns 204. FIG. 8A is a view for illustrating an example in which the patterns 204 are formed on a bonding surface side of the second wafer 201 to the first wafer 101, and FIG. 8B is a view for illustrating an example in which the patterns 204 are formed on an opposite surface to the bonding surface. The patterns 204 in the second wafer 201 may be formed on the bonding surface side or on the surface opposite to the bonding surface.

Figure 9A:
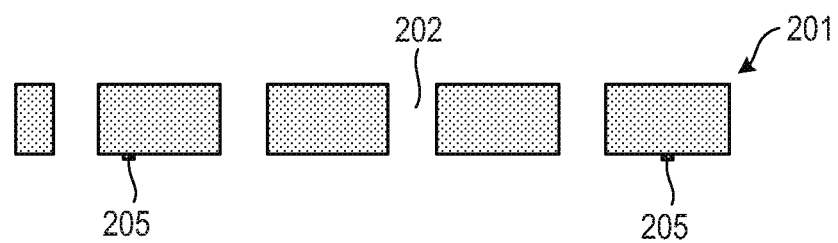
FIG. 9A, FIG. 9B, and FIG. 9C are sectional views for illustrating a method of forming an alignment pattern.
Figure 9B:
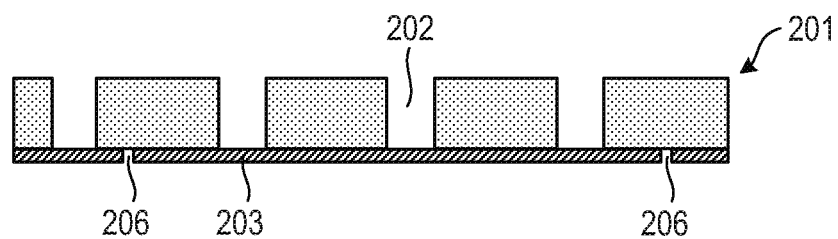
Figure 9C:
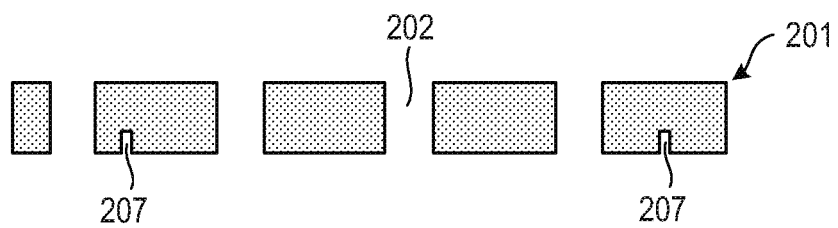

FIG. 9A and FIG. 9C are views for illustrating methods of forming the patterns 204 for alignment in the second wafer 201. The method illustrated in FIG. 9A is a method of forming patterns 205 on a thin film of metal or the like in advance in the second wafer 201. The method illustrated in FIG. 9B is a method of forming patterns 206 in the intermediate layer 203 used for bonding the first wafer 101. The method illustrated in FIG. 9C is a method of forming patterns 207 in the second wafer 201 itself, together with the structural bodies 202 such as holes, grooves, and cavities formed in the second wafer 201. The method of forming the patterns 204 for alignment in the second wafer 201 may be any one of the methods illustrated in FIG. 9A and FIG. 9C. The patterns 105 are also formed on the first wafer 101, but the patterns are generally formed on the first surface simultaneously when the functional element 103 is formed on the first surface of the first wafer 101.

Figure 10A:
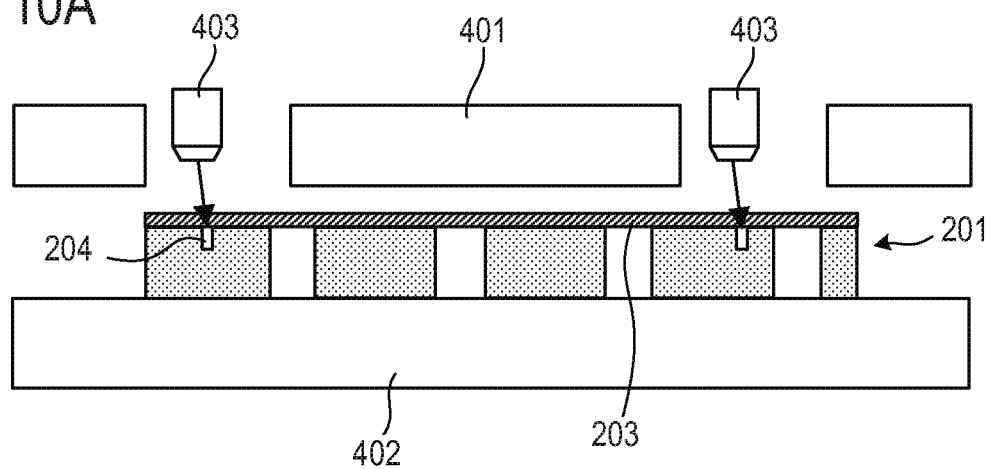
FIG. 10A, FIG. 10B, and FIG. 10C are sectional views for illustrating a procedure of manufacturing the bonded wafer.
Figure 10B:
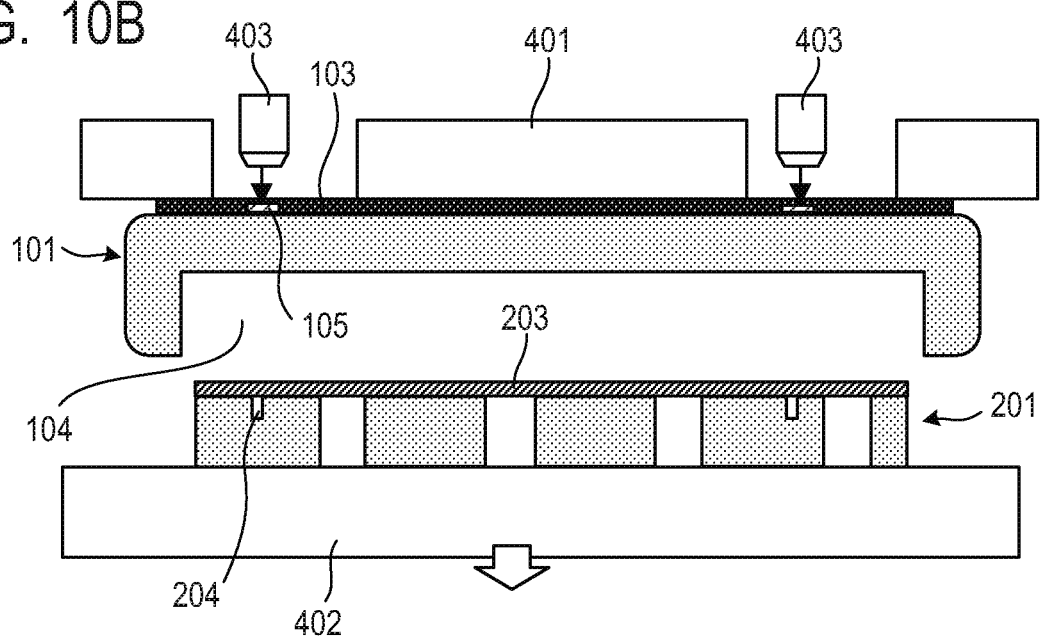
Figure 10C:
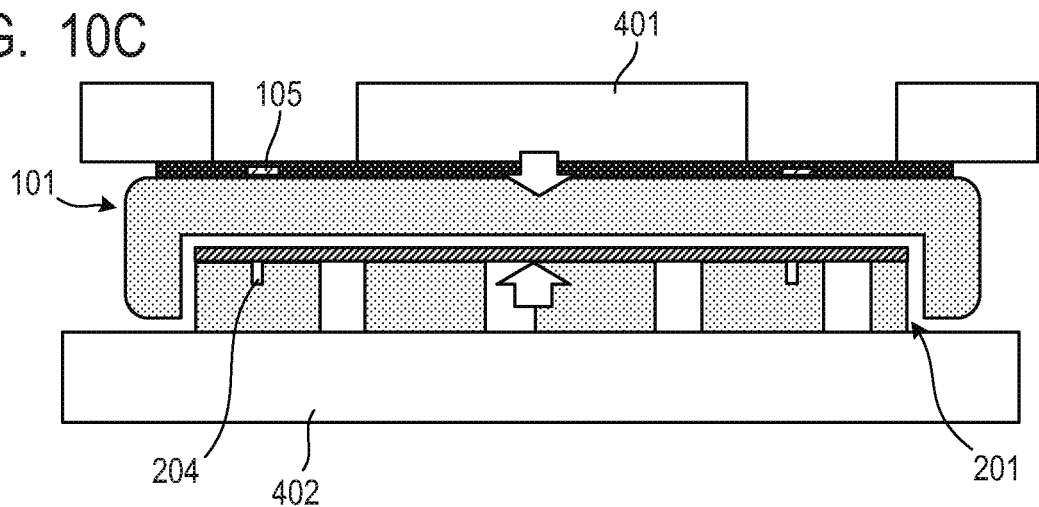

Next, the alignment between the first wafer 101 and the second wafer 201 is described. FIG. 10A to FIG. 10C are views for illustrating an example of the method for alignment when the patterns 204 for alignment are formed on the bonding surface side of the second wafer 201 as illustrated in FIG. 8A. In this case, two stages 401 and 402 provided to face each other are used. Microscopes 403 are provided on a side of the stage 401. First, as illustrated in FIG. 10A, the second wafer 201 is set on the stage 402 and the patterns 204 are detected by the microscopes 403. Then, as illustrated in FIG. 10B, the stage 402 is retracted as indicated by an arrow in the drawing, the first wafer 101 is set on the stage 401, and the patterns 105 are detected by the microscopes 403. Finally, as illustrated in FIG. 10C, based on the detection results of the patterns 105 and 204, the stages 401 and 402 are aligned, and the two stages 401 and 402 are brought close to each other as indicated by the arrows to bond the first wafer 101 to the second wafer 201.

Figure 11A:
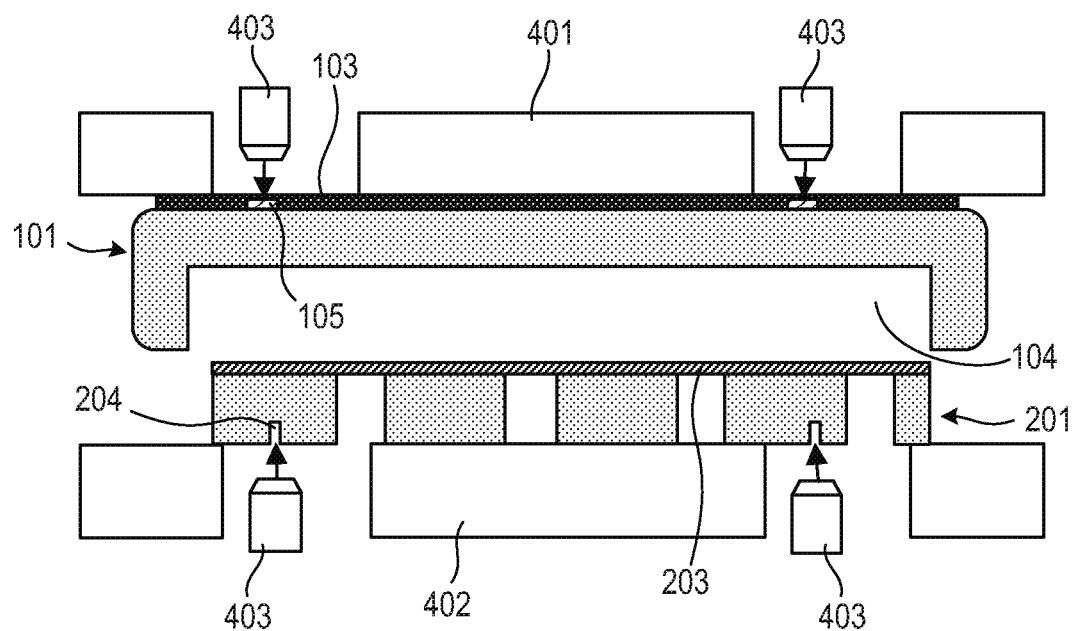
FIG. 11A and FIG. 11B are sectional views for illustrating the procedure of manufacturing the bonded wafer.
Figure 11B:
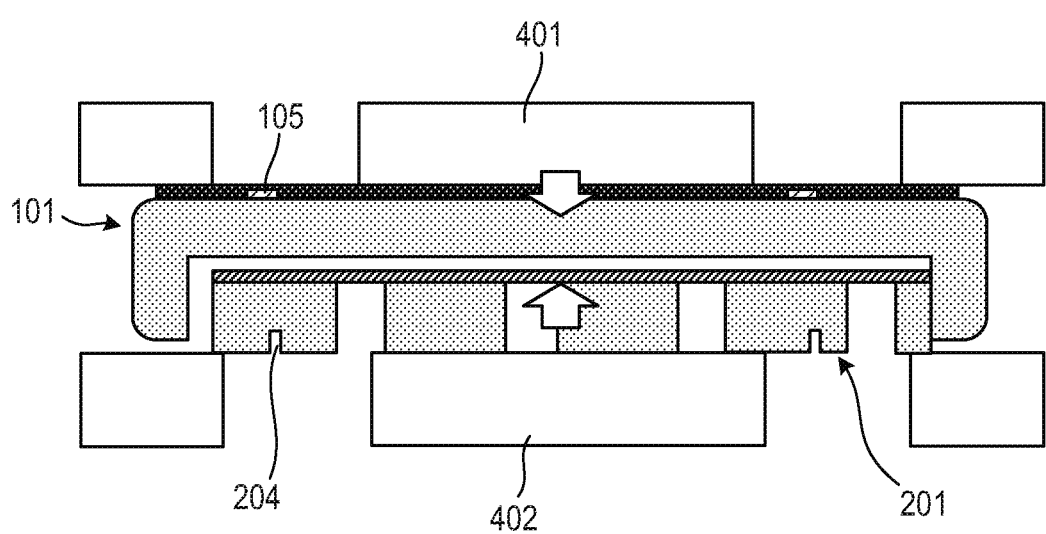

FIG. 11A and FIG. 11B are views for illustrating an example of a method for alignment when the patterns 204 for alignment are formed in the surface opposite to the bonding surface in the second wafer 201 as illustrated in FIG. 8B. The two stages 401 and 402 facing each other are used, but, in this case, the microscopes 403 are provided on each side of the stages 401 and 402. As illustrated in FIG. 11A, the first wafer 101 is set on the stage 401, the second wafer 201 is set on the stage 402, and the patterns 105 and 204 of the wafers 101 and 201 are detected by the microscopes 403, respectively. Next, as illustrated in FIG. 11B, based on the detection results of the patterns 105 and 204, the stages 401 and 402 are aligned, and the two stages 401 and 402 are brought close to each other as indicated by the arrows in the drawing to bond the first wafer 101 and the second wafer 201. The methods with the use of these patterns 105 and 204 for alignment illustrated in FIG. 10A to FIG. 10C and FIG. 11A and FIG. 11B are not limited to a case in which the first wafer 101 and the second wafer 201 have any patterns, but may be used for controlling the bonding positions of the wafers.

Figure 12:
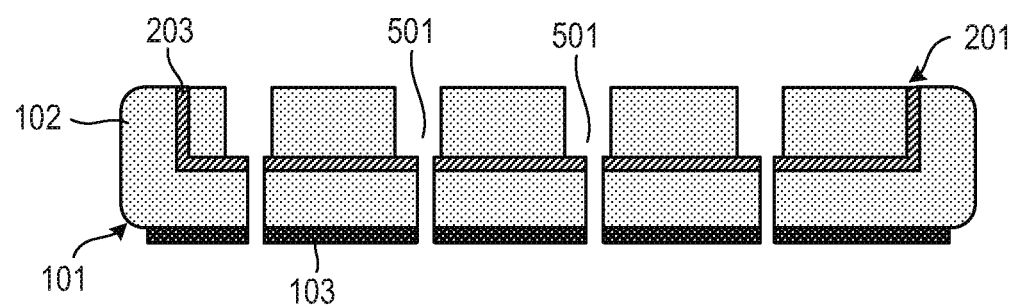
FIG. 12 is a sectional view of the bonded wafer.

In each of the bonded wafers described above, a multistage through hole shape as illustrated in FIG. 12 can be formed. The multistage through hole shape forms through holes penetrating entire wafers when a plurality of wafers are laminated, and hole diameters change in a stepwise manner. With the multistage through hole shape illustrated in FIG. 12, through holes 501 are formed which continuously penetrate the first wafer 101 and the second wafer 201 in addition to the intermediate layer 203 therebetween. The hole diameter of each of the through holes 501 is larger in the second wafer 201 than in the first wafer 101. The through hole 501 also penetrates a portion of the first wafer 101 on which the functional element 103 is provided. The multistage through hole shape is used for forming various micro devices, for example, flow paths or liquid supply ports of a liquid discharge head or a microfluidic device, through electrode holes for electrical wirings, and the like. Although being different from through holes, a multistage through structure is also used in micro mirrors, microphones, and the like, and the multistage through hole shape illustrated above is applicable thereto.

A manufacturing process of the multistage through hole shape illustrated in FIG. 12 is described. The through hole shape is formed by a first step of etching the first wafer 101 to the intermediate layer 203, a second step of etching the second wafer 201 to the intermediate layer 203, and a third step of etching the intermediate layer 203. The first step is a step of etching the bonded wafer from the surface (surface on which the functional element 103 is formed) side to the intermediate layer 203 with the use of the first mask pattern. The second step is a step of etching from the rear surface side of the bonded wafer to the intermediate layer 203 with the use of a second mask pattern. The third step is a step of etching and removing the intermediate layer 203 from any one of the surface sides already etched of the bonded wafer after at least one of the first step and the second step is performed. It is appropriately determined which of the first step and the second step is to be performed first based on a size or a structure of the patterns. Further, the multistage through hole shape described above is applicable not only to circular or polygonal so-called holes, but also to a multistage shape of various devices. Example 5 to be described later is a result of actually implementing the through hole forming method described above.

The multistage through hole shape illustrated in FIG. 12 can also be formed by a method different from that described above. For example, there is a method illustrated in Example 6 described later. This method is configured such that a first mask pattern is formed on the intermediate layer 203 in advance, then the wafers 101 and 201 are bonded through the intermediate layer 203, and finally the wafers 101 and 201 are subjected to two-step etching process. In the two-step etching process, with the use of the second mask pattern, the bonded wafer is etched from any one of surface sides to the intermediate layer 203, and then, with the use of the first mask pattern formed on the intermediate layer 203, another side of the bonded wafer is etched. The first mask pattern formed on the intermediate layer 203 in advance may be a pattern which penetrates the intermediate layer 203, or may be a step-shaped pattern which does not penetrate the intermediate layer 203.

EXAMPLES

Next, a bonded wafer according to the present disclosure and its effects are described in more detail byway of examples in comparison to a comparative example.

Example 1

Figure 13A:
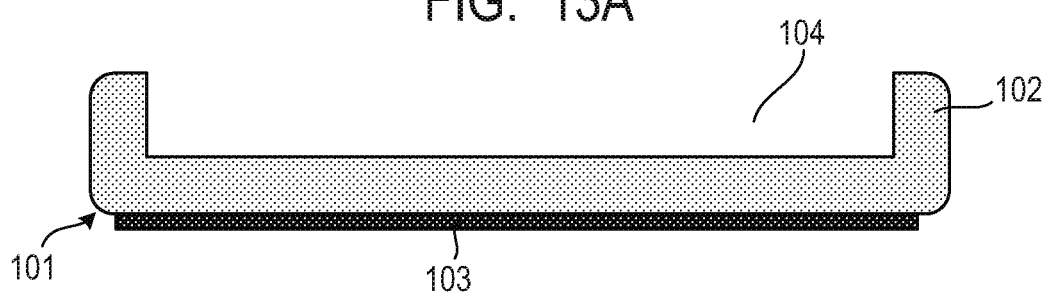
FIG. 13A, FIG. 13B, FIG. 13C, and FIG. 13D are sectional views for illustrating a procedure of manufacturing the bonded wafer in Example 1 of the present disclosure.

FIG. 13A to FIG. 13D are views for illustrating manufacturing processes of a bonded wafer in Example 1. First, as illustrated in FIG. 13A, as with a sample in Example 1, the first wafer 101, on which the annular protrusion 102 was formed in advance, was prepared. On the first surface (lower surface in the drawing) of the first wafer 101, wiring patterns to be served as the functional element 103 are formed in advance. The first wafer 101 is a silicon wafer having a diameter of 200 mm and a thickness of 725 µm, and a central portion is engraved to leave the annular protrusion 102 having a width of about 6 mm from an outer periphery thereof. The thickness of the first wafer 101 in the recess 104 was about 200 µm. The engraved depth for forming the recess 104 is about 525 µm.

Figure 13B:
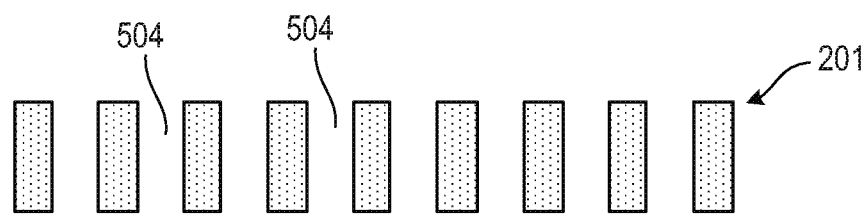
Figure 13C:
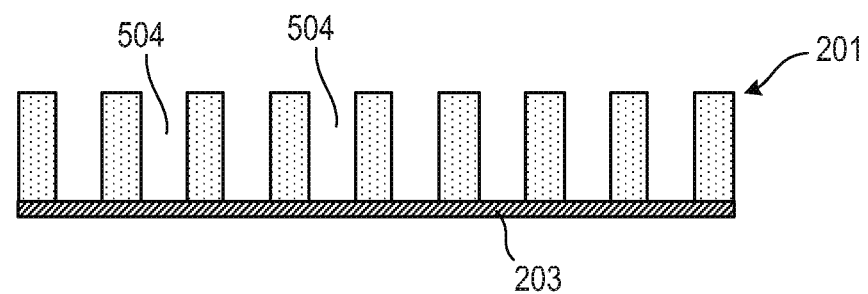
Figure 13D:
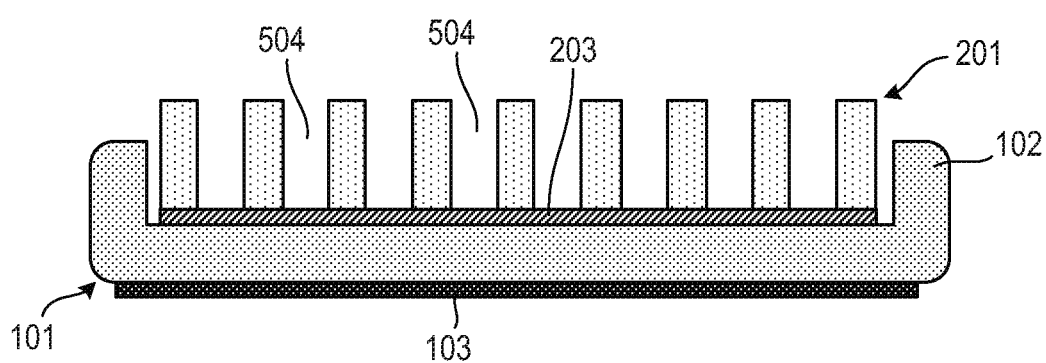

As the second wafer 201, a glass wafer having a diameter of 187 mm and a thickness of 625 µm was prepared. As illustrated in FIG. 13B, a large number of through holes 504 are formed as structural bodies by sandblast processing in advance in the second wafer 201. Next, as illustrated in FIG. 13C, an epoxy resin film (TMMF (trade name); manufactured by Tokyo Ohka Kogyo Co., Ltd.) as an intermediate layer 203 was heated at 40° C. and laminated on one surface (surface to be a bonding surface with the first wafer 101) of the second wafer 201. Then, the second wafer 201 was overlapped so as to be fitted into the recess 104 surrounded by the annular protrusion 102 of the first wafer 101, and was pressure-bonded under a condition of 60° C. and 7000N with the use of a hot press device. In the present example, in the state after the bonding, the second wafer 201 protrudes about 100 µm more than the first wafer 101. Finally, a bonded wafer was heated at 200° C. for 60 minutes to sufficiently cure the epoxy resin of the intermediate layer 203, with the result that the bonded wafer as illustrated in FIG. 13D was obtained.

Comparative Example

Figure 14A:
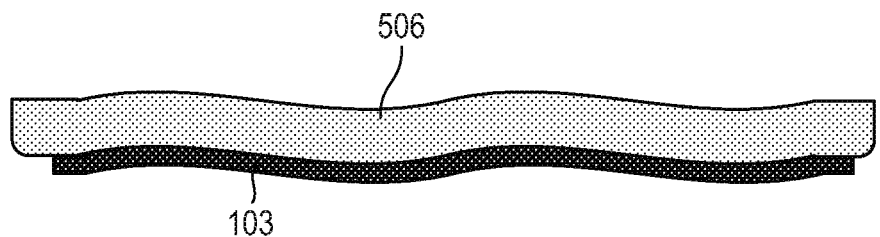
FIG. 14A, FIG. 14B, FIG. 14C, and FIG. 14D are sectional views for illustrating a procedure of manufacturing the bonded wafer in Comparative Example of the present disclosure.
Figure 14B:
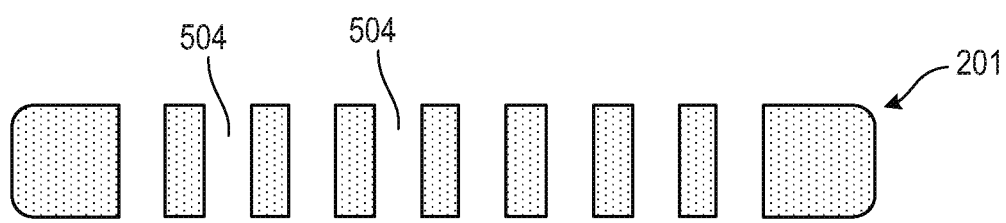
Figure 14C:
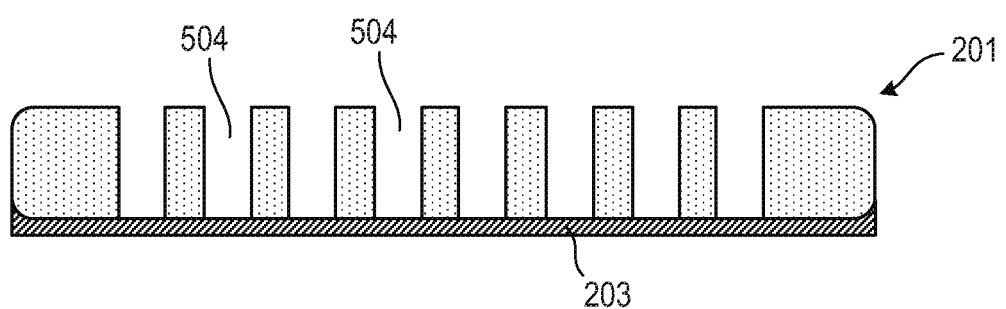
Figure 14D:
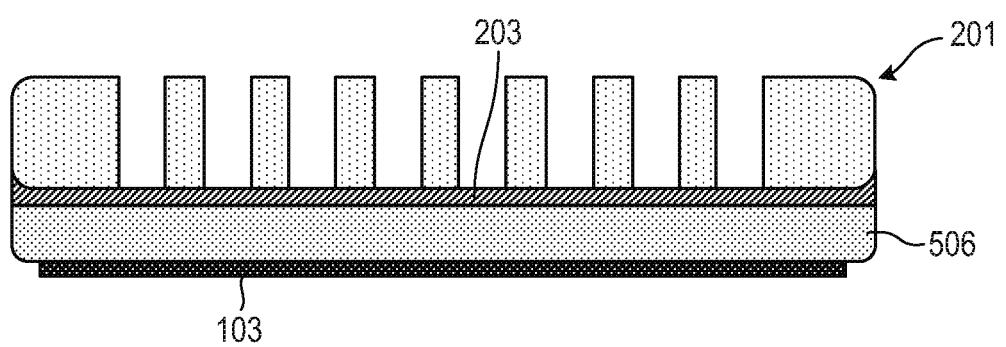

FIG. 14A to FIG. 14D are views for illustrating manufacturing processes of a bonded wafer in Comparative Example. As illustrated in FIG. 14A, a thinned silicon wafer having a thickness of 200 µm and a diameter of 200 mm was prepared as a comparison wafer 506. In a first surface of the comparison wafer 506, wiring patterns served as the functional element 103 are formed in advance. Strength of the comparison wafer 506 is so small such that the wafer itself is curved by its own weight, and hence thinning processing was performed under a state in which a commercially available back grind tape (ADWILL E-8180 (trade name); manufactured by Lintec) (not shown) was laminated. Next, as the second wafer 201, a glass wafer having a diameter of 200 mm and a thickness of 625 µm was prepared. Further, in the second wafer 201, as illustrated in FIG. 14B, a large number of through holes 504 are formed by sandblasting processing in advance. Next, as illustrated in FIG. 14C, an epoxy resin film (TMMF (trade name); manufactured by Tokyo Ohka Kogyo Co., Ltd.) was also heated at 40° C. and laminated as the intermediate layers 203 on one surface of the second wafer 201. Then, the second wafer 201 was overlapped on the comparison wafer 506, and pressure-bonded under a condition of 60° C. and 7000N with the use of a hot press device. On this occasion, the back grind tape does not withstand the heating, and hence the back grind tape was peeled off from the comparison wafer 506 in advance, and then the pressure bonding was performed. Finally, the bonded wafer was heated at 200° C. for 60 minutes to sufficiently cure the epoxy resin as the intermediate layer, with the result that a bonded wafer of Comparative Example illustrated in FIG. 14D was obtained.

Ten bonded wafer samples were produced for each of Example 1 and Comparative Example. In Example 1, the samples could be produced without any particular problems, but, in Comparative Example, one sample was broken when the comparison wafer 506 was handled, two samples were broken when the back grind tape was peeled off, and one sample was broken at the time of press-fitting and pressurizing in bonding.

Example 2

Figure 15A:
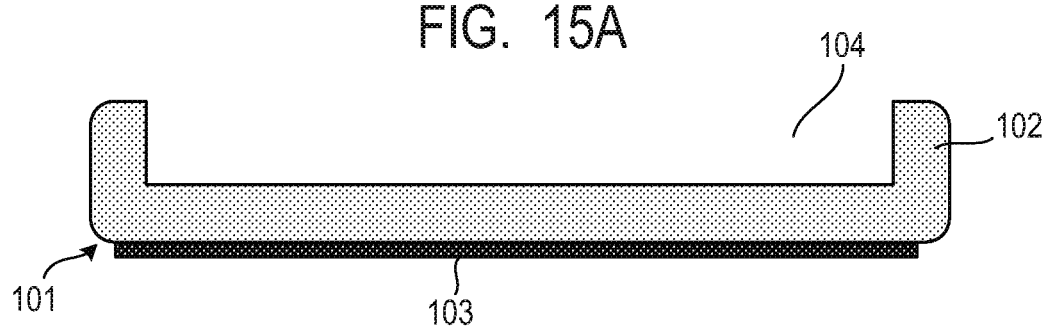
FIG. 15A, FIG. 15B, FIG. 15C, and FIG. 15D are sectional views for illustrating a procedure of manufacturing the bonded wafer in Example 2 of the present disclosure.

In Example 2, a sample of a bonded wafer to be directly bonded through a thermal oxide film (silicon oxide film) 304 was produced. FIG. 15A to FIG. 15D are views for illustrating manufacturing processes of a bonded wafer in the second aspect. A first wafer 101 having the annular protrusion 102 similar to that of Example 1 was prepared. In order to form the engraved recess 104 of the first wafer 101 having a mirror surface, polishing processing was performed by chemical mechanical polishing (CMP). The CMP processing was performed with the use of a non-woven pad (SUBA 400 (trade name); manufactured by Nitta Haas) and alkaline slurry liquid containing colloidal silica. Then, finishing CMP processing was performed with the use of a suede pad (Supream (trade name); manufactured by Nitta Haas) and alkali slurry liquid also containing colloidal silica. FIG. 15A is a view for illustrating the first wafer 101 after the polishing processing.

Figure 15B:
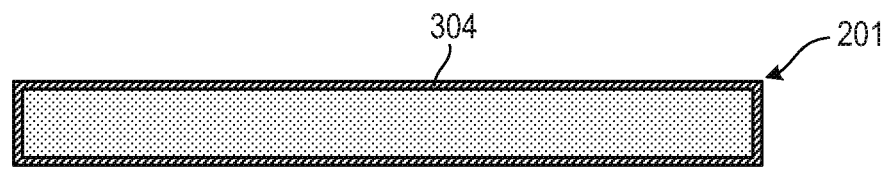
Figure 15C:
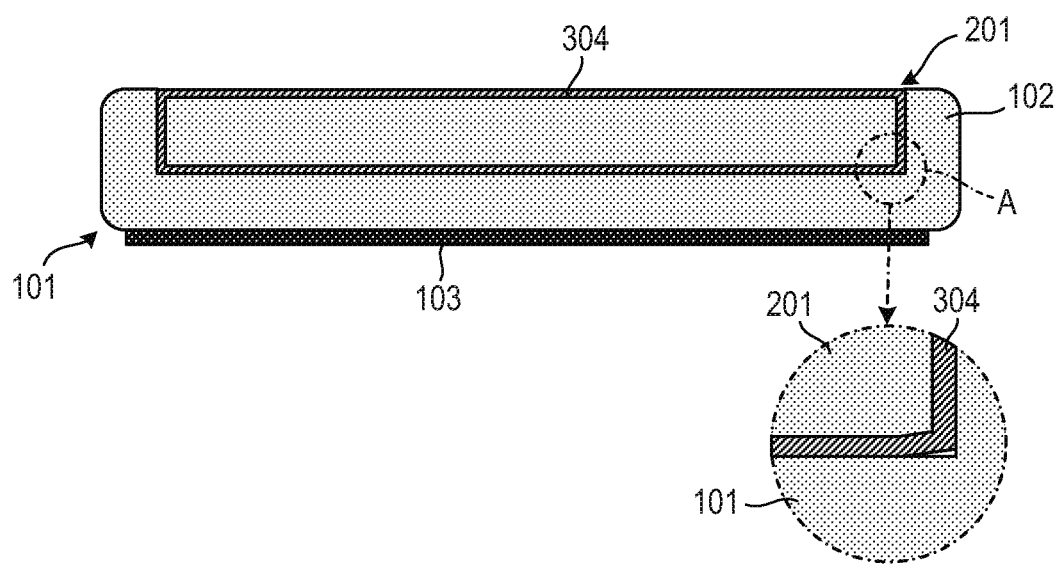
Figure 15D:
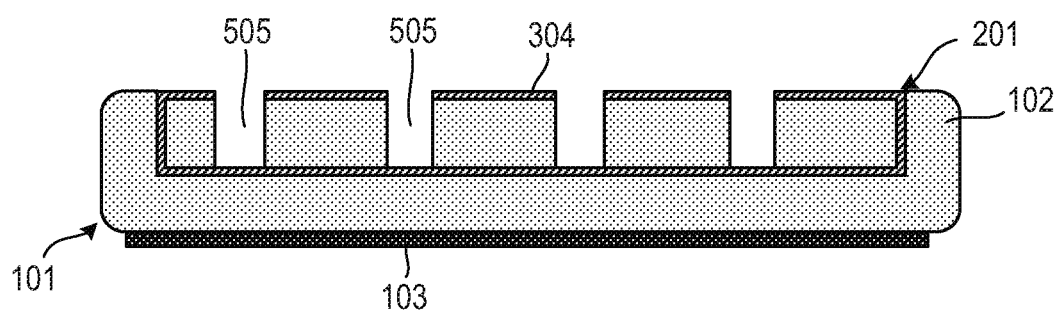

Next, a second wafer 201 similar to that of Example 1 was prepared. In this example, a thickness of the second wafer 201 was set to 525 µm, thermal oxidation was performed in advance, and as illustrated in FIG. 15B, a thermal oxide film 304 having a thickness of 300 nm to be an intermediate layer was formed on an entire surface of the second wafer 201. Then, an engraved surface (second surface) of the first wafer 101 and a surface of the thermal oxide film 304 of the second wafer 201 were plasma-treated for surface activation. For the plasma-treatment, an EVG-810 (trade name; manufactured by EV Group) was used. Next, after the surfaces, which had been subjected to the plasma-treatment, were overlapped for temporary bonding, heat treatment was performed at 300° C. for one hour, and both surfaces were sufficiently bonded by direct bonding. As illustrated in FIG. 15C, the surface at a top of the annular protrusion 102 of the first wafer 101 and a surface opposite to a bonding surface of the second wafer 201 were formed substantially flat. In order to confirm whether the direct bonding was performed without any problems, when a bonding state in the bonded wafer was observed with the use of infrared rays, as illustrated as an enlarged view of an A-portion encircled by a dashed dotted line in FIG. 15C, a region about 1 mm, which had not been bonded, was observed in an outer peripheral portion of the second wafer 201. The region is considered to be formed due to the fact that a vicinity of the level difference has not been sufficiently polished by an influence of the annular protrusion 102 when the engraved portion of the first wafer 101 has been polished.

Next, a desired pattern was formed by a photoresist on the surface on the second wafer 201 side of the bonded wafer. The thermal oxide film 304 was etched by wet etching with the use of the photoresist pattern as a mask until the thermal oxide film 304 was penetrated. Subsequently, the second wafer 201 was etched by silicon dry etching in the Bosch process until the second wafer 201 was penetrated to form cavity (hollow) structures 505, and a bonded wafer illustrated in FIG. 15D was obtained. For the dry etching, an ASE-Pegasus (trade name; manufactured by SPP Technologies) was used. In Example 2, the sample of the bonded wafer could be produced without any problems. No breakage such as cracking occurred at the time of sample production.

Example 3

In Example 3, a bonded wafer was formed with the use of a second wafer 201 having the step-shaped portion 301 as described above with reference to FIG. 6. FIG. 16A to FIG. 16E are views for illustrating manufacturing processes of the bonded wafer in Example 3. As in Example 1, a first wafer 101, on which the annular protrusion 102 was formed in advance, was prepared. In a silicon wafer having a diameter of 200 mm and a thickness of 625 μm, a central portion was engraved to leave the annular protrusion 102 having a width of about 6 mm from the outer periphery to form the recess 104, and as illustrated in FIG. 16A, the first wafer 101 was obtained. A thickness of the first wafer 101 at the recess 104 is about 200 μm, and an engraved depth is about 425 μm. Further, as illustrated in FIG. 16B, as the second wafer 201, a wafer was prepared, in which an outer peripheral portion of a silicon wafer having a diameter of 200 mm and a thickness of 625 μm was processed to form a step by a width of about 6.5 mm and a relative height of 425 μm in a radial direction. Next, as illustrated in FIG. 16C, a benzocyclobutene resin (CYCLOTENE (trade name); manufactured by Dow Chemical Co., Ltd.) as an intermediate layer 203 was coated to form a film on a surface of the second wafer 201 to be bonded to the first wafer 101, including the portion subjected to the step processing. Then, the second wafer 201 was overlapped so as to be fitted into the recess 104 surrounded by the annular protrusion 102 of the first wafer 101, and was gradually heated at 300° C., while being applied with a pressure of 3000N with the use of a hot press device, and was pressure-bonded.

The second wafer 201 has the step-shaped portion 301 corresponding to the annular protrusion 102 of the first wafer 101, and hence the surface on the second wafer 201 side in the bonded wafer becomes a flat surface. The benzocyclobutene resin used as the intermediate layer 203 has a characteristic in which viscosity is decreased by being heated at about 150° C., and therefore fluidity at a wafer bonding interface was high, and uniform bonding as the intermediate layer 203 could be performed. As a result, as illustrated in FIG. 16D, a stepped portion between the annular protrusion 102 of the first wafer 101 and the outer periphery of the second wafer 201 was also bonded by the intermediate layer 203 made of the benzocyclobutene resin which was filled fluidly. The stepped portion was also bonded by the intermediate layer 203, and hence no damage such as chipping or cracking occurred in the portion of the step-shaped portion 301 on the outer periphery of the second wafer 201. Finally, by a similar procedure as that of Example 2, the cavity structures 505 were formed on the second wafer 201 to obtain a bonded wafer as illustrated in FIG. 16E. In Example 3, the sample of the bonded wafer could be produced without any problems. No breakage such as cracking occurred at the time of sample production.

Example 4

Figure 17A:
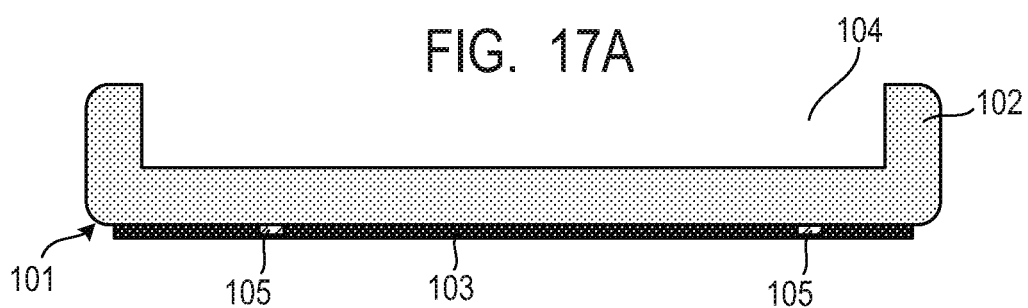
FIG. 17A, FIG. 17B, FIG. 17C, FIG. 17D, and FIG. 17E are sectional views for illustrating a procedure of manufacturing the bonded wafer in Example 4 of the present disclosure.

In Example 4, alignment was performed with the use of patterns 105 formed on a first wafer 101 and patterns 204 for alignment formed in a second wafer 201 to produce a bonded wafer. FIG. 17A to FIG. 17E are views for illustrating manufacturing processes of a bonded wafer in Example 4. First, as illustrated in FIG. 17A, a first wafer 101, on which the annular protrusion 102 was formed in advance and alignment marks which are the patterns 105 used for alignment were formed, was prepared. Wiring patterns, which serve as the functional element 103 are formed in advance on the first surface of the first wafer 101, and the patterns, which are alignment marks, are also formed with the wiring patterns. The first wafer 101 is a silicon wafer having a diameter of 200 mm and a thickness of 725 μm, and a central portion is engraved to leave the annular protrusion 102 having a width of about 6 mm from an outer periphery thereof. The thickness of the first wafer 101 in the recess 104 was about 200 μm. The engraved depth for forming the recess 104 is about 525 μm.

Figure 17B:
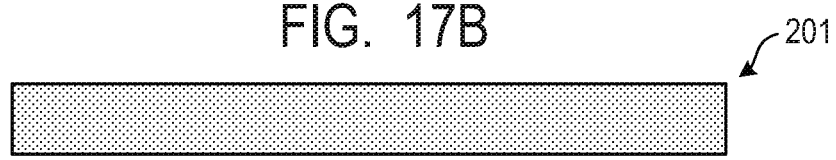
Figure 17C:
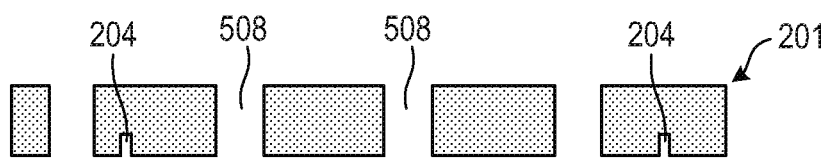

As the second wafer 201, as illustrated in FIG. 17B, a silicon wafer having a diameter of 187 mm and a thickness of 525 μm was prepared. A photoresist (PMER-P-CY-1000 (trade name); manufactured by Tokyo Ohka Kogyo Co., Ltd.) was coated on the second wafer 201, and exposure and development were performed to form a cavity pattern with a width of about 400 μm. On this occasion, a resist pattern corresponding to the patterns 204 for alignment was formed at a position corresponding to the patterns 105 for alignment formed on the first wafer 101. Next, with the photoresist pattern as a mask, etching was performed until the position of the cavity pattern was penetrated by silicon dry etching in the Bosch process to turn into a cavity (hollow) 508. For the etching, an ASE-Pegasus (trade name; manufactured by SPP Technologies) was used. On this occasion, a surface opposite to the resist pattern of the second wafer 201 was protected with a protective tape (Echrostape (trade name); manufactured by Mitsui Chemicals Tosoh Cello). The resist pattern corresponding to the patterns 204 for alignment is smaller in size than the cavity pattern. Based on the characteristic of silicon dry etching in which as a size is smaller, an etching rate is slower, as illustrated in FIG. 17C, the patterns 204 for alignment were formed as holes or grooves which do not penetrate the second wafer 201.

Figure 17D:
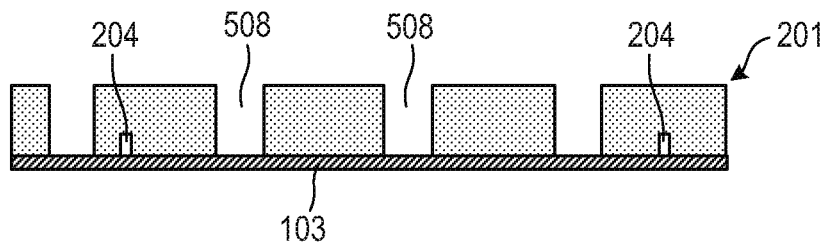
Figure 17E:
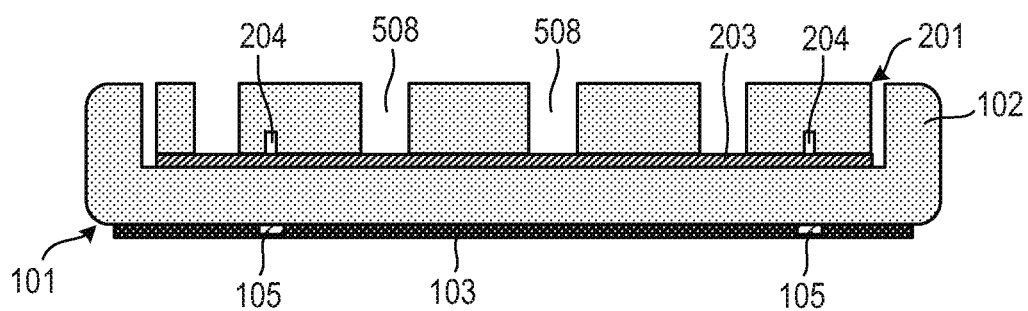

Next, the protective tape laminated on the second wafer 201 was peeled off, and the second wafer 201 was immersed in a peeling solution (Microposit Remover 1112A (trade name); manufactured by Rohm and Haas) to peel off the photoresist. Further, as illustrated in FIG. 17D, an epoxy resin film (TMMF (trade name); manufactured by Tokyo Ohka Kogyo Co., Ltd.), while being heated at 40° C., was laminated as an intermediate layer 203 on one surface of the second wafer 201. With the use of the patterns 105 for alignment of the first wafer 101 and the patterns 204 for alignment formed on the second wafer 201, the first wafer 101 and the second wafer 202 were aligned. EVG-6200: EV Group was used for the alignment. Finally, with the use of a hot press device (EVG-520IS (trade name); manufactured by EV Group), the first wafer 101 and the second wafer 201 were pressure-bonded under a condition of 60° C. and 7000N to obtain a bonded wafer as illustrated in FIG. 17E.

Example 5

In Example 5, as an application example of a bonded wafer having a multistage through hole shape, a liquid discharge head wafer was produced. When the liquid discharge head using a semiconductor manufacturing technology is produced, a large number of liquid discharge heads can be obtained from one bonded wafer. A bonded wafer, in a state in which a large number of liquid discharge heads are collected before being separated into individual liquid discharge heads, is referred to as "liquid discharge head wafer". Multistage through holes were formed as liquid supply ports configured to supply discharge liquid to positions of energy generating elements that generate energy for discharge. FIG. 18A, to FIG. 18G are views for illustrating manufacturing processes of the liquid discharge head wafer in Example 5.

First, as with Examples 1-4, as illustrated in FIG. 18A, the first wafer 101, on which an annular protrusion 102 was formed in advance, was prepared. In a silicon wafer having a diameter of 200 mm and a thickness of 725 µm, a central portion was engraved to leave the annular protrusion 102 having a width of about 6 mm from an outer periphery to form a recess 104, to thereby form the first wafer 101. On a first surface (surface opposite to a surface on which the annular protrusion 102 was formed) of the first wafer 101, a functional element 103, wiring patterns, and patterns 105 for alignment are formed. In particular, heaters as energy generating elements 601 in the liquid discharge head are formed. The functional element 103 includes a drive circuit configured to drive the energy generation elements 601 which are heaters, and the wiring patterns include wirings to connect the energy generating elements 601 to the drive circuit. A thickness of the first wafer 101 in the recess 104 is about 200 µm, and an engraved depth is about 525 µm.

As a second wafer 201, as illustrated in FIG. 18B, a silicon wafer having a diameter of 187 mm and a thickness of 525 µm was prepared. A benzocyclobutene resin (CYCLOTENE (trade name); manufactured by Dow Chemical Co.) as an intermediate layer 203 was coated to form a film on one surface of the second wafer 201, and the second wafer 201 was overlapped so as to be fitted into the recess 104 surrounded by the annular protrusion 102 of the first wafer 101. Then, pressure-bonding was performed with the use of a hot press device under a condition of 300° C. and 3000N, and as illustrated in FIG. 18C, a bonded wafer was obtained. Multiple through holes were formed in the bonded wafer. First, a photoresist (PMER-P-CY-1000 (trade name); manufactured by Tokyo Ohka Kogyo Co., Ltd.) was coated on the second wafer 201 side of the bonded wafer, exposure and development were performed, and a rectangular pattern having a width of 400 µm for forming common liquid supply flow paths 603 is formed. The rectangular pattern is to be a second mask pattern. Next, by silicon dry etching in the Bosch process with the photoresist pattern as a mask, the second wafer 201 was etched until the second wafer 201 was penetrated. For the etching, an ASE-Pegasus (trade name; manufactured by SPP Technologies) was used. The intermediate layer 203 made of a benzocyclobutene resin played a role of an etching stop layer, and as illustrated in FIG. 18D, the common liquid supply flow paths 603 extending to the intermediate layer 203 on an entire surface in the second wafer 201 could be formed.

Next, a photoresist (PMER-P-CY-1000 (trade name); manufactured by Tokyo Ohka Kogyo Co., Ltd.) was also coated on the first wafer 101 side of the bonded wafer, exposure and development were performed, and a square pattern having each side of 50 µm to form independent liquid supply ports 602 was formed as a first mask pattern. By silicon dry etching in the Bosch process with the photoresist pattern as a mask, the first wafer 101 was etched until the first wafer 101 was penetrated. For the etching, an ASE-Pegasus (trade name; manufactured by SPP Technologies) was used. On this occasion, on the second wafer 201 side of the bonded wafer, the common liquid supply flow paths 603 were already formed, and therefore a protective tape (Ecros tape (trade name); manufactured by Mitsui Chemicals Tosoh Co., Ltd.) was laminated to be flat, and the processes were flowed. Further, in the etching, the intermediate layer 203 made of a benzocyclobutene resin played a role of an etching stop layer, and as illustrated in FIG. 18E, the independent liquid supply ports 602 extending to the intermediate layer 203 on an entire surface in the first wafer 191 could be formed.

Next, the benzocyclobutene resin of the intermediate layer 203 was removed by a chemical dry etching process with the use of plasma of oxygen and tetrafluoromethane (CF4), and as illustrated in FIG. 18F, liquid supply ports 604, which are multistage through holes that penetrate a bonded wafer, were obtained. Finally, lamination of a dry film (TMMF (trade name); manufactured by Tokyo Ohka Kogyo Co., Ltd.) made of an epoxy resin, exposure and development were repeated twice to form liquid flow paths 605 and ejection orifices 606 for liquid. Thus, as illustrated in FIG. 18G, a liquid discharge head wafer having the liquid supply ports 604 in a multistage shape was obtained.

Example 6

In Example 6, as an application example of a bonded wafer having a multistage through hole shape, a liquid discharge head wafer having liquid supply ports by multistage through holes is produced as Example 5. However, manufacturing processes of Example 6 are different from the manufacturing processes of Example 5. FIG. 19A to FIG. 19H illustrate the manufacturing processes of the liquid discharge head wafer in the sixth aspect.

First, as with Examples 1-4, as illustrated in FIG. 19A, the first wafer 101, on which an annular protrusion 102 was formed in advance, was prepared. In a silicon wafer having a diameter of 200 mm and a thickness of 725 µm, a central portion was engraved to leave the annular protrusion 102 having a width of about 6 mm from an outer periphery to form a recess 104, to thereby form the first wafer 101. As with Example 5, on a first surface of the first wafer 101, a functional element 103 including a drive circuit, wiring patterns including wirings for energy generating elements 601, patterns 105 for alignment, and energy generating elements 601 are formed. A thickness of the first wafer 101 in the recess 104 is about 200 µm, and an engraved depth is about 525 µm. Further, in this example, a surface of the recess 104 was polished as the same procedure as that illustrated in Example 2 described above to be processed into a mirror surface.

As a second wafer 201, a silicon wafer having a diameter of 187 mm and a thickness of 475 µm was prepared. On a surface of the second wafer 201, as illustrated in FIG. 19B, a thermal oxide film 304 is formed in advance to have a thickness of about 1.5 µm as an intermediate layer. A photoresist (PMER-P-CY-1000 (trade name); manufactured by Tokyo Ohka Kogyo Co., Ltd.) was coated on the surface of the second wafer 201, exposure and development were performed, and a square pattern having each side of 50 µm as a pattern for forming independent liquid supply ports 602 was formed. Then, the thermal oxide film 304 as the intermediate layer was etched by wet etching with the use of the photoresist pattern as a mask. BHF110U (trade name; manufactured by Daikin Industries, Ltd.) was used as a chemical solution for wet etching. In the etching, instead of removing all the thermal oxide film 304, holes or grooves having a depth of about 1.2 µm are formed to have a step-shape in the thermal oxide film 304. As a result, recessed patterns 208 were formed at planned positions for forming independent liquid supply ports 602. The recessed patterns 208 are also served as a mask pattern at the time of etching in a later process, and are also called "first mask pattern". On this occasion, patterns 204 for alignment were simultaneously formed. Then, the second wafer 201 was immersed in a peeling solution (Microposit remover 1112A (trade name); manufactured by Rohm and Haas) to peel off the photoresist. FIG. 19C is a view for illustrating the second wafer in this state.

Next, an engraved surface (second surface) of the first wafer 101 and a surface of the thermal oxide film 304 of the second wafer 201 were plasma-treated for surface activation. For the plasma-treatment, an EVG-810 (trade name; manufactured by EV Group) was used. With the use of the patterns 105 for alignment of the first wafer 101 and the patterns 204 for alignment formed on the second wafer 201, the first wafer 101 and the second wafer 202 were aligned. For the alignment, an EVG-6200 manufactured by EV Group was used. Next, after the plasma-treated surfaces were overlapped, and after temporary bonding was performed, a heat treatment was performed at 300° C. for 1 hour, and as illustrated in FIG. 19D, both wafers were sufficiently bonded by direct bonding to form a bonded wafer. Then, a photoresist (PMER-P-CY-1000 manufactured by Tokyo Ohka Kogyo Co., Ltd.) was coated on the second wafer 201 side of the bonded wafer, exposure and development were performed, and a rectangular pattern having a width of 400 µm to form the common liquid supply flow paths 603 was formed. The rectangular pattern by the resist is served as a second mask pattern. Next, with the use of the resist pattern as a mask, the thermal oxide film 304 was etched by wet etching until the thermal oxide film 304 was penetrated, and subsequently, the second wafer 201 was etched by silicon dry etching in the Bosch process until the second wafer 201 was penetrated. For the dry etching, an ASE-Pegasus (trade name; manufactured by SPP Technologies) was used. Accordingly, as illustrated in FIG. 19E, the common liquid supply flow paths 603 were formed on an entire surface of the second wafer 201 as structural bodies. The thermal oxide film 304 to be etched as described above is only the thermal oxide film 304 formed on an upper surface in the second wafer 201 in the drawing. The thermal oxide films 304 on a lower surface side of the second wafer 201 in the drawing remain thin at positions of the recessed patterns 208, and play a function as etching stop layers in silicon dry etching.

Next, dry etching was further performed to remove the thermal oxide film 304 remaining at the position of the recessed patterns 208, and as illustrated in FIG. 19F, holes by the recessed patterns 208 were exposed in bottom surfaces of the common liquid supply flow paths 603. In this state, when the bonded wafer is observed from the second wafer 201 side, in the bottom surfaces of the common liquid supply flow paths 603, the second surface of the first wafer 101 is exposed in accordance with shapes of the recessed patterns 208. In the dry etching as described above, a device similar to the device (ASE-Pegasus (trade name); manufactured by SPP Technologies) used in the silicon etching was used, but the Bosch process was not used. Then, with the use of the thermal oxide films 304 exposed on the bottom surfaces of the common liquid supply flow paths 603 as masks, the first wafer 101 was etched from the second wafer 201 side by silicon dry etching in the Bosch process until the first wafer 101 was penetrated. For the dry etching, an ASE-Pegasus (trade name; manufactured by SPP Technologies) was used. As a result, the independent liquid supply ports 602 penetrating the first wafer 101 are formed to correspond to positions of the recessed patterns 208 firstly formed in the thermal oxide film 304. The common liquid supply flow paths 603 and the independent liquid supply ports 602 communicate to each other. Therefore, as illustrated in FIG. 19G, liquid supply ports 604, which penetrate through the bonded wafer and has a multistage through hole shape, were formed. Finally, with a similar procedure as that of Example 5, liquid flow paths 605 and ejection orifices 606 were formed, and as illustrated in FIG. 19H, a liquid discharge head wafer having multistage liquid supply ports was obtained.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-164514, filed Sep. 3, 2018, which is hereby incorporated by reference herein in its entirety.

What is claimed is:

1. A bonded wafer comprising:
    a first wafer having a first surface and a second surface opposite to the first surface, and including a functional element on the first surface; and
    a second wafer in which a structure having at least one of a hole, a groove, and a cavity is formed;
    wherein an annular protrusion is formed to have a shape to extend along an outer periphery on the second surface of the first wafer;
    wherein at least a portion of the second wafer is a reduced-diameter portion having a diameter smaller than an inner diameter of the annular protrusion; and
    wherein, under a state in which the reduced-diameter portion is fitted into a region surrounded by the annular protrusion of the first wafer, the second wafer is bonded to the second surface at least at the region.

2. The bonded wafer according to claim 1, wherein the first wafer and the second wafer are bonded such that a height of a position of a surface opposite to a bonding surface with the first wafer of the second wafer and a height of a top of the annular protrusion are constant in a direction perpendicular to the second surface.

3. The bonded wafer according to claim 1, wherein the surface on a side to be bonded to the first wafer of the second wafer is formed to have a stepped shape corresponding to a shape of the annular protrusion, and at least a portion of the annular protrusion is covered by the second wafer.

4. The bonded wafer according to claim 1, wherein the first wafer and the second wafer are bonded through an intermediate layer.

5. The bonded wafer according to claim 4, wherein the intermediate layer includes one or more materials selected from a group consisting of silicon oxide, an organic resin, metal, and metal oxide.

6. The bonded wafer according to claim 4, wherein the first wafer and the second wafer are bonded through the intermediate layer even at a position of the annular protrusion.

7. The bonded wafer according to claim 4, wherein a through hole is formed, which continuously penetrates the first wafer, the intermediate layer, and the second wafer, and a diameter of the through hole changes in a stepwise manner.

8. A method of manufacturing a bonded wafer comprising:
- forming an annular protrusion to have a shape to extend along an outer periphery of a first wafer on a second surface opposite to a first surface in the first wafer having a functional element on the first surface;
- forming a reduced-diameter portion having a diameter smaller than an inner diameter of the annular protrusion in a second wafer;
- bonding the first wafer to the second wafer through an intermediate layer such that the reduced-diameter portion is fitted into a region surrounded by the annular protrusion; and
- forming a structure having at least one of a hole, a groove, and a cavity in the second wafer.

9. The method of manufacturing a bonded wafer according to claim 8, wherein the forming of the structure in the second wafer is performed prior to the step of bonding the first wafer to the second wafer.

10. The method of manufacturing a bonded wafer according to claim 8, wherein the forming of the structure in the second wafer is performed after the step of bonding the first wafer to the second wafer.

11. The method of manufacturing a bonded wafer according to claim 8, wherein, with the use of a pattern formed on the first wafer and a pattern for alignment formed in the second wafer corresponding to the pattern, alignment between the first wafer and the second wafer is performed.

12. A method of forming a through hole for forming a through hole in the bonded wafer according to claim 4, comprising:
- etching the first wafer from the first surface side to the intermediate layer with the use of a first mask pattern;
- etching the second wafer from a surface opposite to the first surface to the intermediate layer in the bonded wafer with the use of a second mask pattern; and
- etching to remove the intermediate layer from a side of any one of surfaces of the bonded wafer,
- wherein a through hole having a hole diameter, which changes in a stepwise manner, is formed in the bonded wafer.

* * * * *